(12) United States Patent
Mizuhaya et al.

(10) Patent No.: US 11,063,173 B2
(45) Date of Patent: Jul. 13, 2021

(54) METHOD OF MANUFACTURING LIGHT EMITTING DEVICE

(71) Applicant: NICHIA CORPORATION, Anan (JP)

(72) Inventors: Takayuki Mizuhaya, Anan (JP); Takehiro Nishimori, Anan (JP)

(73) Assignee: NICHIA CORPORATION, Anan (JP)

( * ) Notice: Subject to any disclaimer, the term of this patent is extended or adjusted under 35 U.S.C. 154(b) by 224 days.

(21) Appl. No.: 16/203,612

(22) Filed: Nov. 29, 2018

(65) Prior Publication Data
US 2019/0165205 A1     May 30, 2019

(30) Foreign Application Priority Data
Nov. 30, 2017   (JP) .............................. JP2017-230314

(51) Int. Cl.
*H01L 33/56* (2010.01)
*H01L 33/00* (2010.01)
*H01L 33/62* (2010.01)
*H01L 25/075* (2006.01)
*H01L 33/48* (2010.01)

(52) U.S. Cl.
CPC ...... *H01L 33/0075* (2013.01); *H01L 25/0753* (2013.01); *H01L 33/62* (2013.01); *H01L 33/486* (2013.01); *H01L 33/56* (2013.01); *H01L 2933/0033* (2013.01); *H01L 2933/0066* (2013.01)

(58) Field of Classification Search
CPC ....................................................... H01L 33/56
USPC .......................................................... 438/26
See application file for complete search history.

(56) References Cited

U.S. PATENT DOCUMENTS

| | | | |
|---|---|---|---|
| 2002/0039001 A1 | 4/2002 | Nagai et al. | |
| 2012/0286301 A1* | 11/2012 | Kobayakawa | ........ H01L 33/647 257/88 |
| 2015/0221623 A1* | 8/2015 | Tischler | ................ H01L 33/486 257/89 |
| 2016/0247984 A1 | 8/2016 | Liu et al. | |
| 2017/0345982 A1* | 11/2017 | Abe | ......................... H01L 33/62 |
| 2021/0135068 A1* | 5/2021 | Leisen | .............. H01L 31/02322 |

FOREIGN PATENT DOCUMENTS

| | | |
|---|---|---|
| JP | 10-256450 | 9/1998 |
| JP | 2003-086846 | 3/2003 |
| JP | 2007-243053 | 9/2007 |
| JP | 2009-147178 | 7/2009 |
| JP | 2011-138849 | 7/2011 |

* cited by examiner

*Primary Examiner* — Hsin Yi Hsieh
(74) *Attorney, Agent, or Firm* — Mori & Ward, LLP

(57) ABSTRACT

A method of manufacturing a light emitting device is provided. The method includes providing a lead frame including a plurality of light emitting devices each including: a light emitting element; a resin molded body including a lead electrode on which the light emitting element is mounted, and a light-shielding member which supports the lead electrode and has a recess accommodating the light emitting element; and a light-transmissive member disposed in the recess. The method further includes: providing a mask including a plurality of through holes, and overlaying the mask on the lead frame so that the resin molded body and the light-transmissive member are exposed at the through holes; and perforating abrasive blasting by blowing a particulate material on a surface of the resin molded body and a surface of the light-transmissive member.

14 Claims, 15 Drawing Sheets

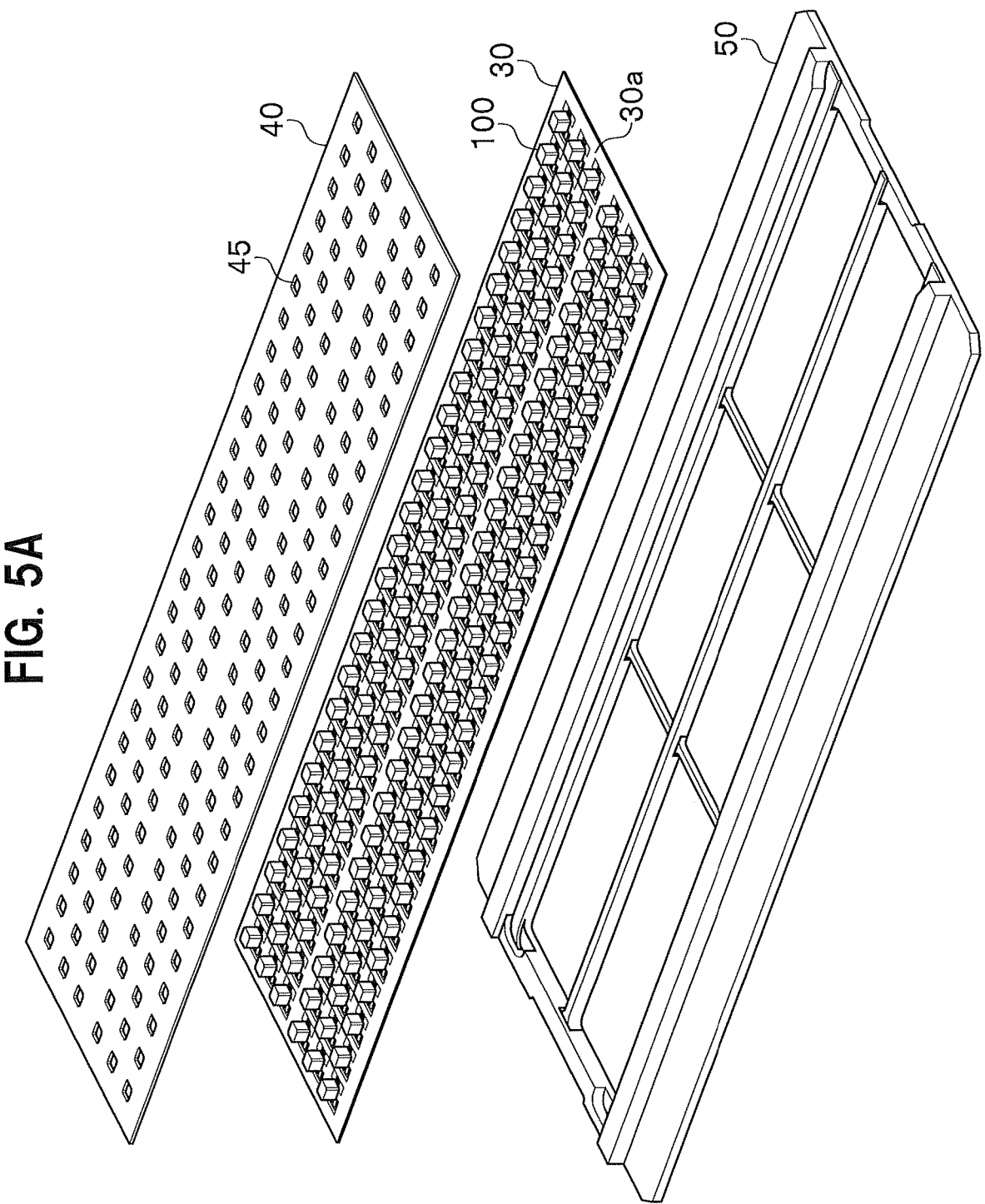

METHOD OF MANUFACTURING LIGHT EMITTING DEVICE

CROSS-REFERENCE TO RELATED APPLICATION

This application claims priority to Japanese Patent Application No. 2017-230314, filed on Nov. 30, 2017, the disclosure of which is hereby incorporated by reference in its entirety.

BACKGROUND

The present disclosure relates to a method of manufacturing a light emitting device.

It has been found that light emitting apparatuses equipped with LEDs have been used for a variety of applications such as illumination devices, the backlights of personal computers (PC) or TV monitors, or large-size displays. The need for the light emitting devices is increasing, with the demand for its improved optical output.

For example, Japanese Unexamined Patent Application Publication No. 2003-086846 describes a display device with which a reduction in display contrast is alleviated. The display device described therein includes a second layer containing a light diffusion member is applied by splaying or the like on a first layer covering a light emitting chip. The reduction in display contrast is realized by the irregularity formed on the second surface which disperse extraneous light.

As other example, Japanese Unexamined Patent Application Publication No. 2007-243053 describes a method of manufacturing a light emitting device, including: forming an uncured resin layer at a light extraction surface of an LED chip; and blowing a fluorescent material in such a manner as to apply into the uncured resin layer. The method described therein provides a light emitting device with reduced variance in concentration of the fluorescent material contained in the color conversion layer and reduced color unevenness.

As described above, there exist various known methods of improving the optical output of the light emitting device by improving the characteristic of the surface layer. For example, according to a known method, the surface of the package is subject to abrasive blasting to make the surface rough, whereby a light emitting device which is less influenced by the reflection of extraneous light is provided.

However, when a plurality of packages is disposed at the lead frame, not only the surface of the packages but also the surface of the lead frame is inevitably subjected to the abrasive blasting (see FIG. 12).

As a result, after the packages are singulated, in the step of bonding the lead electrode of each package to the mounting board via a conductive member such as solder, voids occur at the bonded portion, which results in a reduction in the joining strength between the lead electrode and the mounting board in the light emitting device.

SUMMARY

An embodiment of the present disclosure advantageously provides a method of manufacturing a light emitting device that is less influenced by reflection of extraneous light without reducing joining strength between a lead electrode and a mounting board.

A method of manufacturing a light emitting device includes providing a lead frame including a plurality of light emitting devices each including: a light emitting element; a resin molded body including a lead electrode on which the light emitting element is mounted, and a light-shielding member which supports the lead electrode and has a recess accommodating the light emitting element; and a light-transmissive member disposed in the recess. The method further includes: providing a mask including a plurality of through holes, and overlaying the mask on the lead frame so that the resin molded body and the light-transmissive member are exposed at the through holes; and performing abrasive blasting by blowing a particulate material on a surface of the resin molded body and a surface of the light-transmissive member.

The method of manufacturing a light emitting device according to an embodiment of the present disclosure can provide a light emitting device that is less influenced by the reflection of extraneous light without reducing the joining strength between the lead electrode and the mounting board.

BRIEF DESCRIPTION OF THE DRAWINGS

FIG. 5A is a perspective view schematically showing a mask placing step in the method of manufacturing the light emitting device according to the present embodiment.

DETAILED DESCRIPTION OF EMBODIMENT

Figure 1A:
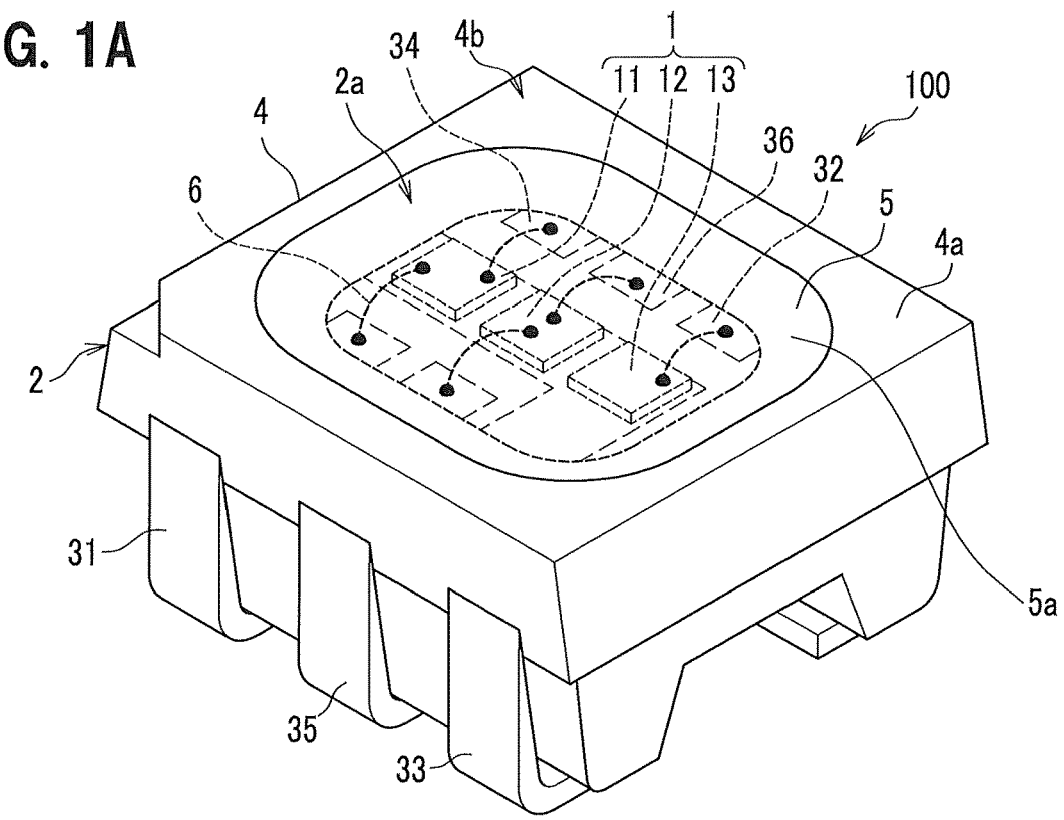
FIG. 1A is a perspective view showing the structure of a light emitting device according to a present embodiment.

In the following, a description will be given of a light emitting device and a method of manufacturing the same according to an embodiment. The drawings referred to the following description schematically show the present embodiment and, accordingly, the scale, interval, positional relationship and the like of the members may be exaggerated or the members may be partially omitted. Further, in the following description, the members denoted by an identical name and reference character are basically identical or similar members, and the description of those members is omitted as appropriate.

Structure of Light Emitting Device

Figure 1B:
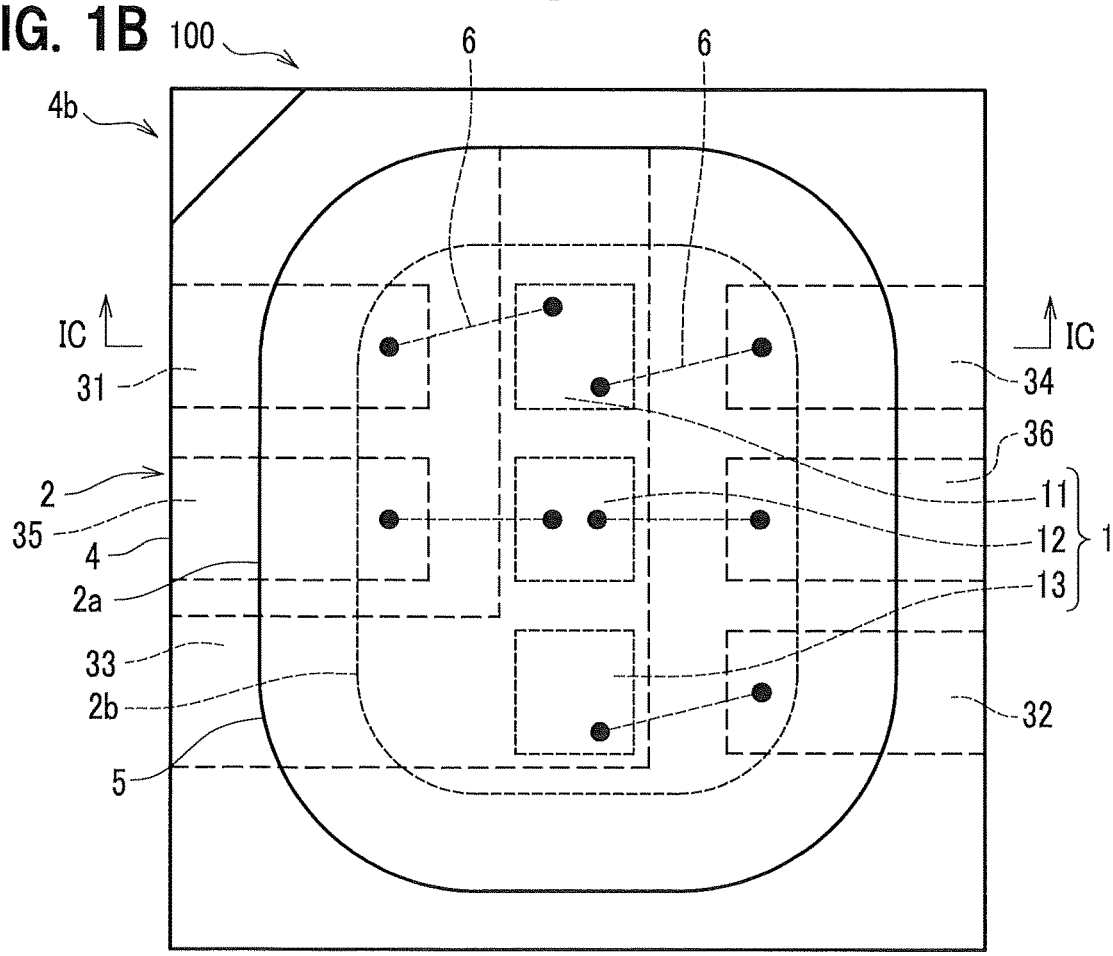
FIG. 1B is a plan view showing the structure of the light emitting device according to the present embodiment.
Figure 1C:
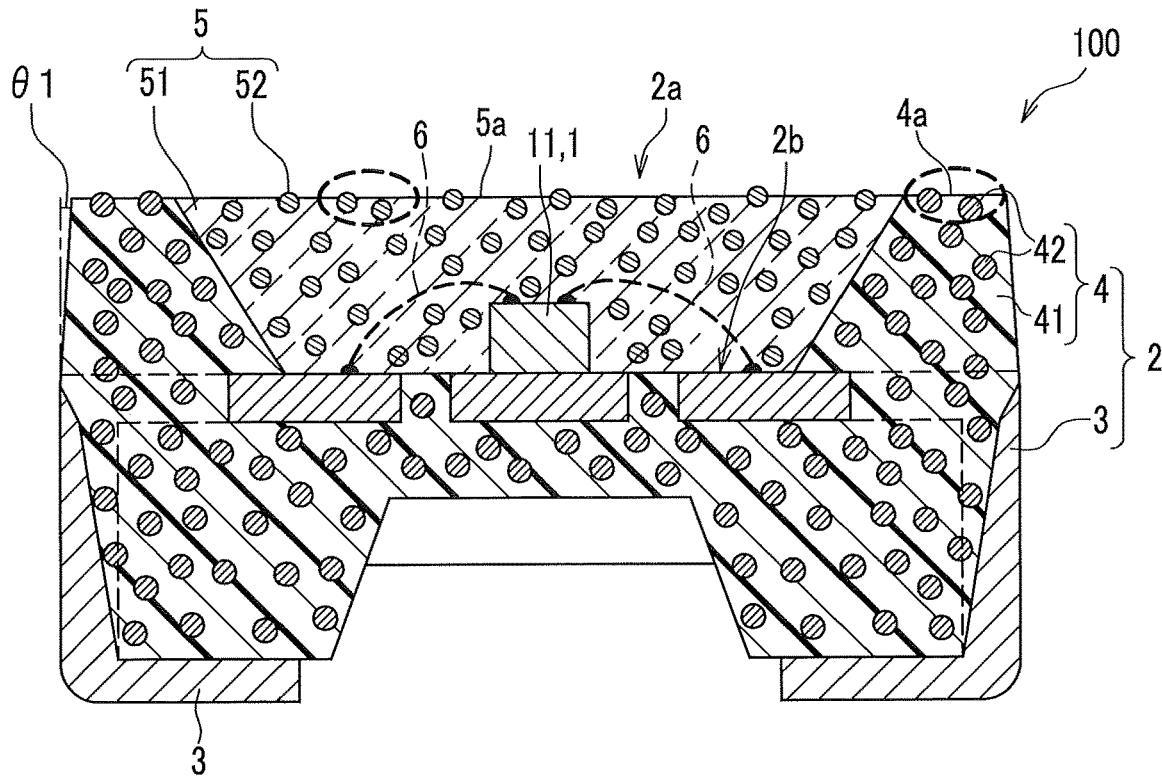
FIG. 1C is a cross-sectional view taken along line IC-IC in FIG. 1B, showing the cross section of the light emitting device according to the present embodiment.

With reference to FIGS. 1A to 1C, a description will be given of the structure of the light emitting device according to the present embodiment.

FIG. 1A is a perspective view showing the structure of the light emitting device according to the present embodiment. FIG. 1B is a plan view showing the structure of the light emitting device according to the present embodiment. FIG. 1C is a cross-sectional view taken along line IC-IC in FIG. 1B, showing the cross section of the light emitting device according to the present embodiment.

Figure 1D:
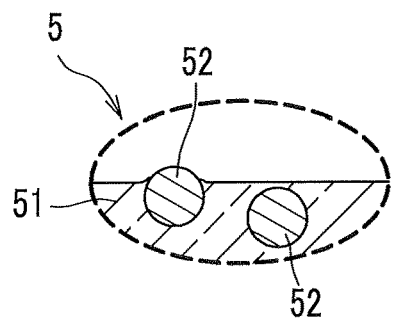
FIG. 1D is an enlarged view of a portion encircled by a broken line in FIG. 1C, showing the surface of a light-transmissive member according to the present embodiment.
Figure 1E:
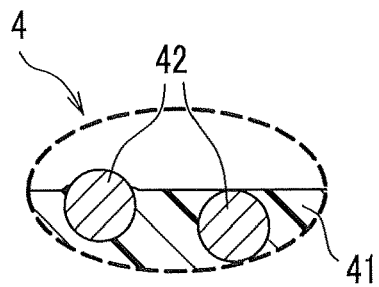
FIG. 1E is an enlarged view of a portion encircled by a broken line in FIG. 1C, showing the surface of a light-shielding member according to the present embodiment.

In FIG. 1C, the portions respectively encircled by broken lines around a surface 4a of a light-shielding member 4 and a surface 5a of a light-transmissive member 5 are respectively enlarged and shown in FIGS. 1D and 1E. Further, in FIG. 1C, a first filler 52 is represented by circles, whereas a second filler 42 is represented by circles which are different in hatching direction and size from those of the circles of the first filler 52. Such shapes do not represent the specific shapes of the corresponding members, and used for the sake of convenience in differentiating between the types of the particles of the fillers.

The light emitting device 100 includes light emitting elements 1 (including light emitting element 11, light emitting element 12, light emitting element 13), a resin molded body 2 including lead electrode 3 (including lead electrode 31, lead electrode 32, lead electrode 33, lead electrode 34, lead electrode 35, lead electrode 36) on which the light emitting elements 1 are mounted and including a light-shielding member 4 supporting the lead electrode 3 and including a recess 2a accommodating the light emitting elements 1, and a light-transmissive member 5 disposed inside the recess 2a. The light emitting elements 1 are electrically connected to the lead electrodes 3 disposed at the bottom surface of the recess 2a using wires 6.

The resin molded body 2 and the light-transmissive member 5 respectively have surfaces subjected to abrasive blasting. Therefore, surface irregularity, that is, a plurality of projections is formed on each of the surfaces. The irregularity of the surfaces is formed by, for example, part of the particles of the second filler 42 contained in the light-shielding member 4 being exposed outside the base material 41 of the light-shielding member 4 from the surface 4a of the light-shielding member 4 structuring the lateral wall of the resin molded body 2. Further, the irregular shapes are formed by, for example, part of the particles of the first filler 52 contained in the light-transmissive member 5 being exposed outside the base material 51 of the light-transmissive member 5 from the surface 5a of the light-transmissive member 5. The abrasive blasting is a process of frosting the light emitting surface of the light emitting device 100.

The light emitting elements 1 are mounted on the bottom surface of the recess 2a of the resin molded body 2. In the present embodiment, three light emitting elements 11, 12, 13 respectively emitting light of different colors are mounted inside the recess 2a. For example, the light emitting element 11 emitting blue light, the light emitting element 12 emitting green light, and the light emitting element 13 emitting red light can be mounted.

Hereinafter, when the three light emitting elements 11, 12, 13 are not particularly differentiated from one another, they may be collectively referred to as the "light emitting element 1".

The light emitting elements 11, 12, 13 are die-bonded onto a lead electrode 33 disposed at the central portion of the bottom surface 2b of the recess 2a. One of electrodes of each of the light emitting elements 11, 12, 13 serves as an anode electrode. The anode electrodes thereof are electrically connected to lead electrodes using wires 6. Other one of electrodes of each of the light emitting elements 11, 12, 13 serves as a cathode electrode. The cathode electrodes thereof are each electrically connected to corresponding one of the lead electrodes using wires 6. That is, the three light emitting elements 11, 12, 13 are structured so that voltage can be applied independently of one another. Thus, the light emitting elements 11, 12, 13 can be individually lit up, or the luminance level can be appropriately adjusted for each of the light emitting elements 11, 12, 13. Thus, the color and luminance of the emission light of the light emitting device 100 can be appropriately changed. Accordingly, the light emitting device 100 can be used as one pixel of a color image display device.

The shape, the size, and the semiconductor material of each of the light emitting elements 1 used herein are not particularly specified. The emission light color of each light emitting element 1 can be one having wavelength appropriately selected according to the intended use. The light emitting elements 11, 12 respectively emitting blue light and green light can each suitably be used for a light emitting element formed of material comprising a nitride semiconductor, which has an emission light wavelength in the near ultraviolet to visible spectrum and expressed by $In_XAl_YGa_{1-X-Y}N$ ($0 \leq X \leq 1$, $0 \leq Y \leq 1$, $X+Y \leq 1$). Further, the light emitting element 13 emitting red light can be formed of material comprising a GaAs-, AlInGaP-, or AlGaAs-based semiconductor.

In the present embodiment, the light emitting elements 1 can each include the positive and negative electrodes disposed on a same surface side, or on different surface sides. When the light emitting elements 1 each include the positive and negative electrodes disposed on the same surface side, the light emitting elements 1 can be any of the face-up mounted type and the face-down mounted type. When a light emitting device includes the plurality of light emitting elements 1, they can differ from each other in the mount type.

The number of the light emitting element 1 mounted in the recess 2a should be one or more. When a light emitting device includes a plurality of light emitting elements 1, the combination of the emission light colors, the outer shape of each of the light emitting elements 1 and the like can be changed as appropriate.

The resin molded body 2 includes the lead electrode 3 and the light-shielding member 4. The resin molded body 2 has a substantially square outer shape as seen in a plan view, and is provided with the recess 2a which opens upward. The recess 2a is a region on which the light emitting elements 1 are mounted, and the bottom surface 2b of the recess 2a is structured by the lead electrode 3 and the light-shielding member 4. Further, the lateral wall of the recess 2a is structured by the light-shielding member 4.

In the resin molded body 2, the surface 4a of the light-shielding member 4 which is the upper surface of the lateral wall of the recess 2a has been subjected to abrasive blasting. Accordingly, part of the particles of the second filler 42 is exposed outside the base material 41, defining surface irregularity, that is, projections, attributed to the particles of the second filler 42 (see FIGS. 1C and 1E).

The outer lateral surfaces of the resin molded body 2 has at least one portion inclined and outwardly spreading from the upper surface, which is the light extraction surface of the light emitting device 100, toward the bottom surface. The inclination angle θ1 of the outer lateral surfaces of the resin molded body 2 is preferably in a range of 1.0° to 2.5° inclusive, and more preferably 1.5° to 2.0° inclusive. The at least one portion of the outer lateral surfaces of the resin molded body 2 is inclined at the predetermined inclination angle θ1, whereby a particulate material becomes less likely to be blown in the lead electrode 3 in an abrasive blasting step (S1007) which will be described later.

The lead electrode 3 is formed by six lead electrodes 31 to 36, and functions as wirings for connecting the three light emitting elements 11 to 13, which are electrically connected to an external power source via the wires 6.

The lead electrodes 31 to 36 each form part of the bottom surface 2b of the recess 2a. The lead electrodes 31 to 36 penetrate through the light-shielding member 4 as seen in a plan view to extend to the end of the outer lateral surfaces, where they bend downward. The lead electrodes 31 to 36 then extend along the outer lateral surfaces of the light-shielding member 4, and bend inward along the lower surface of the light-shielding member 4. The mount surface of the light emitting device 100 is positioned at the lower surface side. The outer lead portions of the lead electrodes 31 to 36 which inwardly bend on the lower surface side of the light-shielding member 4 serve as the external connection parts connected to the outside using a conductive bonding member such as solder.

Because the lead electrodes 31 to 36 have been substantially free of being subjected to abrasive blasting, the surface of the lead electrodes 31 to 36 is substantially not roughened. Accordingly, the light emitting device 100 can be mounted on the mounting board without reducing the joining strength of the bonded portion.

Further, the inner lead portions exposed at the bottom surface 2b of the recess 2a of the lead electrodes 31 to 36 are electrically connected to the light emitting elements 11 to 13 respectively via the wires 6. The lead electrode 34 is electrically connected to the cathode electrode of the light emitting element 11. The lead electrode 35 is electrically connected to the cathode electrode of the light emitting element 12. The lead electrode 32 is electrically connected to the cathode electrode of the light emitting element 13. The lead electrode 31 is electrically connected to the anode electrode of the light emitting element 11. The lead electrode 36 is electrically connected to the anode electrode of the light emitting element 12 The lead electrode 33 is electrically connected to the anode electrode of the light emitting element 13.

The lead electrode 33 has its inner lead portion positioned at the central portion of the bottom surface 2b of the recess 2a, and the inner lead portion also serves as a light emitting element disposed region where the light emitting elements 11 to 13 are bonded using a die-bonding member.

The lead electrode 3 is formed by punching out and bending a flat plate-like metal plate by etching and pressing. The metal plate can be made using known materials used for a lead frame of a resin molded body of a light emitting element. The thickness of the metal plate is selected as appropriate according to the shape or size of the resin molded body. For example, the thickness is in a range of about 100 µm to about 500 µm, and preferably is in a range of 120 µm to 300 µm. The material of the metal plate can be, for example, a Cu-based alloy.

The surface of the inner lead portions of the lead electrode 3 exposed at the bottom surface 2b of the recess 2a can be plated with, for example, Ag, Au, or Ni in order to improve the light reflectivity and/or the bondability to the wire 6 and the die-bonding member.

The light-shielding member 4 is the member that fixes the six lead electrodes 31 to 36 being apart from one another and forms the lateral wall of the recess 2a. The light-shielding member 4 is formed by a material that does substantially not transmit but comparatively blocks light. Therefore, a light-reflective material can be one that blocks light by reflecting the light, or a light-absorptive material that blocks light by absorbing the light.

Specifically, the light-shielding member 4 can be formed of a resin material comprising light-transmissive resin as the base material 41, and the second filler 42 contained therein as a filler for obtaining the light-shielding property.

When the light-shielding member 4 is formed of material comprising a light-reflective material, the light-shielding member 4 functions such that light emitted from each light emitting element 1 propagates through the light-transmissive member 5 and reaches the light-shielding member 4 in order to return into the light-transmissive member 5. This function can improve the light extraction efficiency at the upper surface of the light emitting device 100.

Further, when the light-shielding member 4 is formed of material comprising a light-absorptive material, the light-shielding member 4 absorbs light emitted from light emitting elements 1, transmitting through the light-transmissive member 5 and being incident on the light-shielding member 4. Thus, light can be extracted only from the upper surface of the light emitting device 100.

In the case where either of a light-reflective material and a light-absorptive material is used as the material of the light-shielding member 4, light of the light emitting device 100 is emitted specifically from the surface of the light-transmissive member 5. This can provide a light emitting device 100 that exhibits high contrast between a light emitting region and a non-light emitting region, that is, so-called good "distinguishability".

A resin employed as the base material 41 of the light-shielding member 4 can be, for example, thermoplastic resin or thermosetting resin.

The thermoplastic resin can be, for example, polyamide resin, polyphthalamide resin, liquid crystal polymer, polybutylene terephthalate (PBT), unsaturated polyester or the like.

The thermosetting resin can be, for example, epoxy resin, modified epoxy resin, silicone resin, modified silicone resin or the like.

When the light-shielding member 4 is to exhibit light reflectivity, a light-shielding member 4 can be formed by using light reflective resin material in which the base material 41 contains light reflectivity particles as the second filler 42. The light-reflective substance can be, for example, $TiO_2$, $Al_2O_3$, $ZrO_2$, MgO or the like.

Further, the inner lateral surfaces of the recess 2a preferably exhibit a reflectivity of 70% or more, more preferably 80% or more, in the wavelength range of light emitted from each light emitting element 1. The content of the second filler 42 being as the light-reflective substance in the light-shielding member 4 should be in a range of 5 mass % to 60 mass %, and preferably in a range of 10 mass % to 50 mass %.

Further, the average particle size of the second filler 42 is preferably in a range of about 0.5 μm to about 15 μm. By virtue of the second filler 42 having the size in this range, the light-shielding member 4 exhibits good strength and/or light reflectivity.

Unless otherwise specified, in the present specification, the value of the particle size of fillers or abrasive agent is based on the air permeability method or the Fisher-Sub-Sieve-Sizers No. (the F.S.S.S. method).

The light-shielding member 4 can employ, for example, wollastonite as a reinforcing agent of the second filler.

Further, preferably, the plurality of projections at the surface 4a of the light-shielding member 4 is formed to assume a value in a range of about 0.090 μm to about 0.210 μm in the arithmetic average roughness Ra defined by Japanese Industrial Standards B0601:2013. In particular, with the surface 4a of the light-shielding member 4 having an arithmetic average roughness Ra of 0.130 μm or more, extraneous light can be more efficiently scattered.

When the light-shielding member 4 is to exhibit a light-absorptive property, a light-shielding member 4 can be formed by using light-absorptive resin material in which the base material 41 contains light-absorptive particles as the second filler 42. The light-absorptive substance can be black-color pigment, and more specifically, carbon-based pigment such as carbon black or graphite. When carbon black is added as the light-absorptive substance, it can be added by about 1 mass %.

The light-shielding member 4 can be formed by any molding method using a mold assembly such as transfer molding, injection molding, or compression molding, and an applying method such as screen printing, using the resin material provided with the light reflectivity and/or the mechanical strength by virtue of the base material 41 containing the second filler 42.

Further, the surface 4a of the light-shielding member 4 has surface irregularity, that is, a plurality of projections. The plurality of projections is formed by subjecting the surface 4a to abrasive blasting. The surface 4a of the light-shielding member 4 having undergone the abrasive blasting can be shaped by, for example, exposing part of the particles of the second filler 42 outside the base material 41. Regardless of the exposure of the particles of the second filler 42, the plurality of projections at the surface 4a of the light-shielding member 4 is preferably formed attributed to the particles of the second filler 42.

The surface irregularity formed by the abrasive blasting successfully reduce the regular reflection light component of extraneous light reflected at the surface 4a of the light-shielding member 4. When the light emitting device 100 is used as a pixel in an image display device, any extraneous light irradiated on the image display device has its regular reflection light component reduced. Hence, irrespective of the observing direction, the brightness or darkness, hue and the like are clearly visually recognized.

The light-transmissive member 5 is an encapsulant provided inside the recess 2a of the resin molded body 2, to encapsulate the light emitting elements 1. The light-transmissive member 5 contains the first filler 52 as the filler for adjusting the viscosity of uncured resin when the light-transmissive member 5 is formed using light-transmissive resin as the base material 51, and for obtaining the light diffusion property of the light-transmissive member 5.

Similarly to the surface 4a of the light-shielding member 4, the surface 5a of the light-transmissive member 5 has surface irregularity, that is, a plurality of projections by being subjected to abrasive blasting. The surface 5a of the light-transmissive member 5 having undergone the abrasive blasting is formed by, for example, exposing part of the particles of the first filler 52 outside the base material 51. Regardless of the exposure of the particles of the first filler 52, the surface irregularity of the surface 5a of the light-transmissive member 5 are preferably formed attributed to the particles of the first filler 52 (see FIGS. 1C and 1D). The surface 5a of the light-transmissive member 5 preferably has the surface irregularity also at part of the surface where the first filler 52 are not exposed.

The first filler 52 contained in the light-transmissive member 5 can comprise one type, or two or more of types of filler. Specifically, the fillers can comprise different materials. Alternatively, the fillers can comprise an identical material but can differ from each other in particle size or shape.

Further, the light-transmissive member 5 can contain particles of a light-absorptive substance such as carbon black as other filler by the amount not impairing the light transmissivity. The light-transmissive member 5 containing particles of a light-absorptive substance by a proper amount can reduce emission of regular reflective light from the light extraction surface such as the surface of the lead electrode 3 exposed inside the recess 2a of the resin molded body 2. This function can improve the light distribution characteristic of light emitted from the light emitting device 100.

As necessary, the light-transmissive member 5 can contain particles of a fluorescent material or a coloring pigment, or particles of a light diffusing substance having higher refractive index than reflective index of the base material 51.

The base material 51 of the light-transmissive member 5 can comprise thermosetting resin having light transmissivity. Examples of the base material 51 include silicone resin, epoxy resin, urea resin or the like. The first filler 52 comprises a light-transmissive material having lower refractive index than reflective index of the base material 51. The first filler 52 can be, specifically, $SiO_2$. For example, when the base material 51 is formed of material comprising epoxy resin of which refractive index is 1.53, the first filler 52 can be $SiO_2$ of which refractive index is 1.46.

The average particle size of the first filler 52 preferably is in a range of 0.5 μm to 15 μm inclusive. By virtue of the particle size of the first filler 52 is in this range, a plurality of projections formed attributed to the particles of the first filler 52 can efficiently reduce the regular reflection light component of extraneous light at the surface 5a of the light-transmissive member 5.

The light-transmissive member 5 preferably contains the first filler 52 in a range of about 2 mass % to about 40 mass % inclusive.

The plurality of projections at the surface 5a of the light-transmissive member 5 is preferably formed to assume the value is in a range of about 0.095 μm to about 0.220 μm inclusive, and more preferably 0.180 μm or smaller in the arithmetic average roughness Ra defined by Japanese Industrial Standards B0601:2013.

The first filler 52 having lower refractive index than that of the base material 51 is exposed at the surface 5a of the light-transmissive member 5 which is the light extraction surface of the light emitting device 100. This can reduced the difference in refractive index between the light-transmissive member 5 and the air (of which refractive index is 1.0) being the medium into which light is extracted. Further, by virtue of the difference in refractive index being small at the interface where light is extracted, the light reflectivity at the surface reduces. Accordingly, the light extraction efficiency of the light emitting device 100 to the outside improves. Here, with 0.03 or more of difference in refractive index between the base material 51 and the first filler 52, the exposure of the first filler 52 improves the light extraction efficiency of the light emitting device 100.

The plurality of projections are provided on the surface 4a of the light-shielding member 4 and the surface 5a of the light-transmissive member 5, which is the upper surface of the light emitting device 100. This can prevent or alleviate a situation in which other components tack with or adhere to the light emitting device 100, because the upper surface of the light emitting device 100 is brought into point contact with the other component. This function can facilitate handling or mounting of the light emitting device 100.

In order to improve waterproofness in the recess of the light emitting device 100, the surface 4a of the light-shielding member 4 can be covered with the light-transmissive member 5. In this case, the surface irregularity due to abrasive blasting is not substantially formed at the surface 4a of the light-shielding member 4, and the surface irregularity is formed at the light-transmissive member 5 that covers the light-shielding member 4. The light emitting device 100 having such a structure similarly exhibits the above-described effect.

The wires 6 are wires for electrically connecting electronic components such as the light emitting elements 1 and the protective element to the lead electrodes 31 to 36. Material of the wires 6 can be metal such as Au (gold), Ag (silver), Cu (copper), Pt (platinum), Al (aluminum), or alloy of the foregoing metals. In particular, use of Au for the wires 6 is preferable due to the good thermal conductivity. A diameter of each wire 6 is not particularly specified, and can be selected as appropriate according to the purpose and intended use.

Method of Manufacturing Light Emitting Device

With reference to FIGS. 2 to 9, a description will be given of a method of manufacturing the light emitting device according to the present embodiment.

Figure 2:
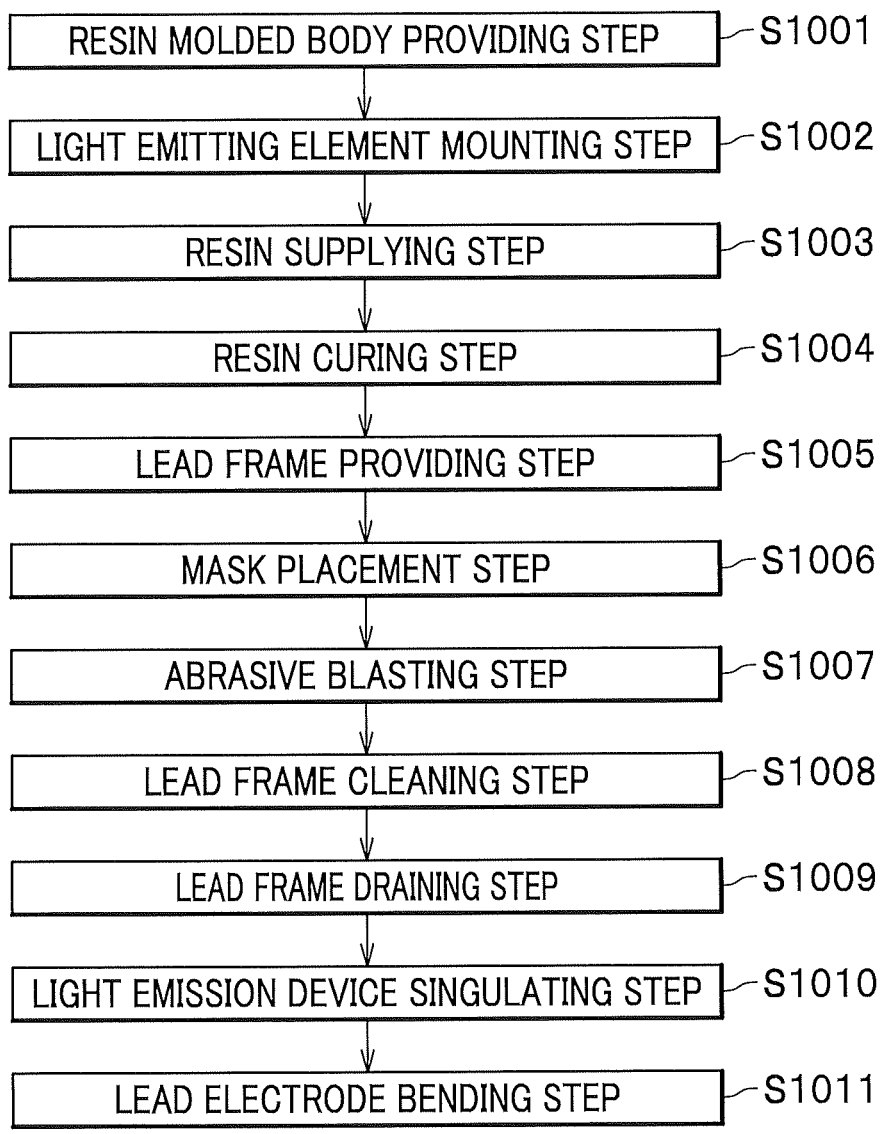
FIG. 2 is a flowchart showing the procedure of a method of manufacturing the light emitting device according to the present embodiment.
Figure 3A:
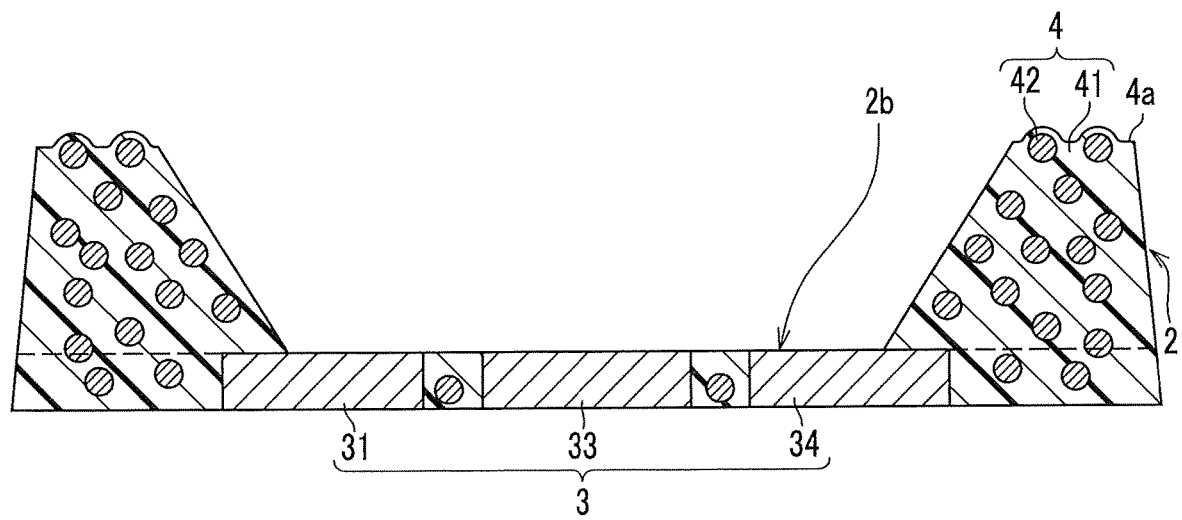
FIG. 3A is a cross-sectional view schematically showing the structure of a resin molded body provided in a resin molded body providing step in the method of manufacturing the light emitting device according to the present embodiment.
Figure 3B:
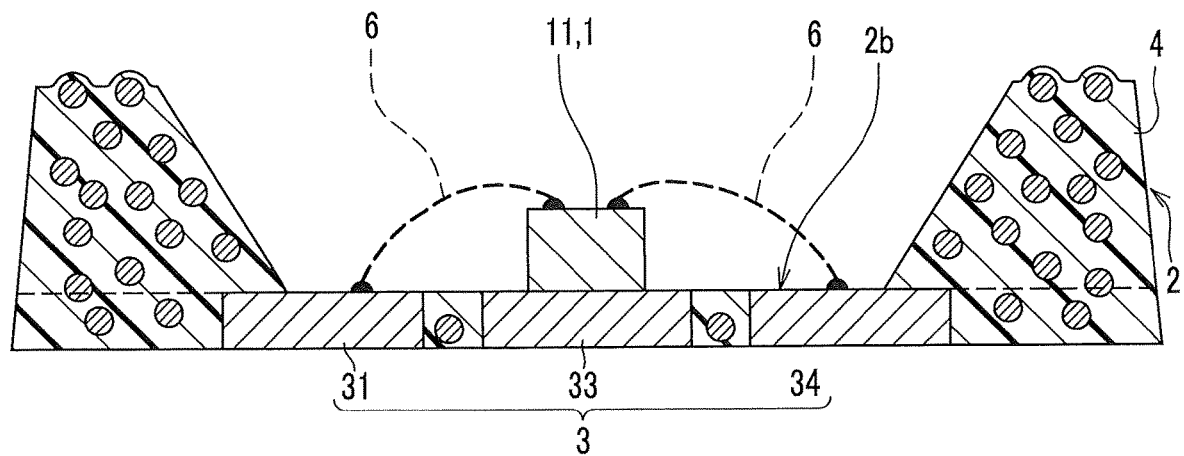
FIG. 3B is a cross-sectional view schematically showing the state where the light emitting element is mounted on the resin molded body in a light emitting element mounting step in the method of manufacturing the light emitting device according to the present embodiment.
Figure 3C:
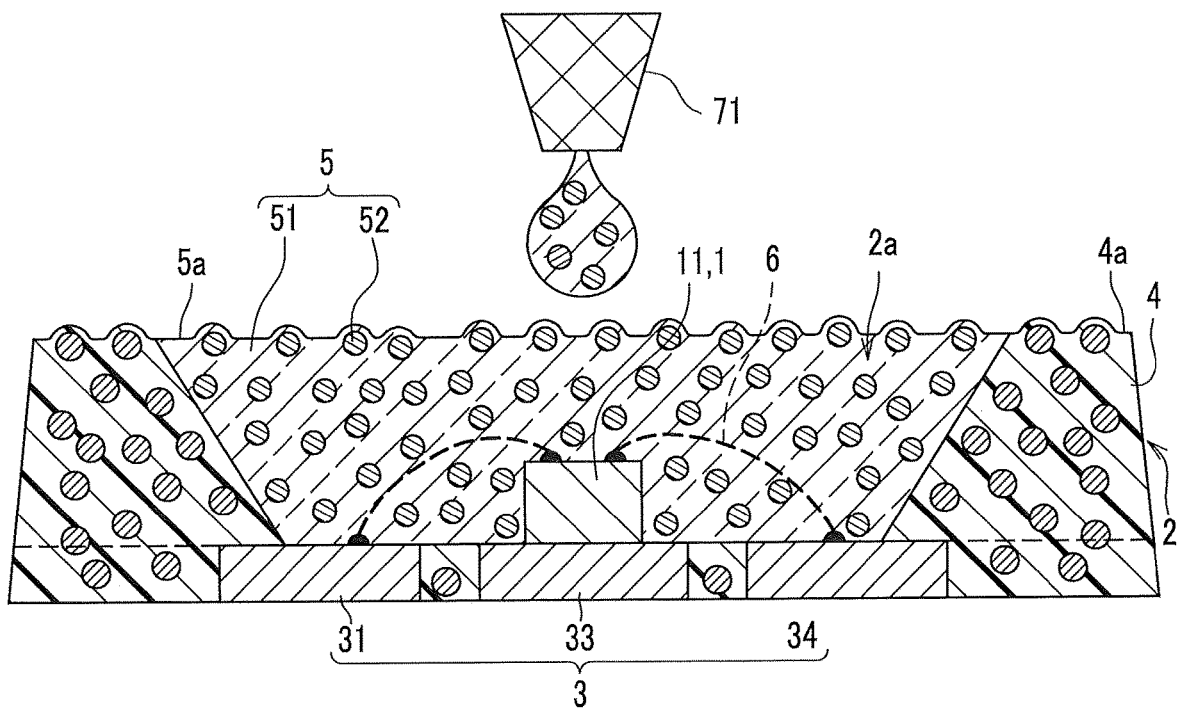
FIG. 3C is a cross-sectional view schematically showing a resin supplying step in the method of manufacturing the light emitting device according to the present embodiment.
Figure 3D:
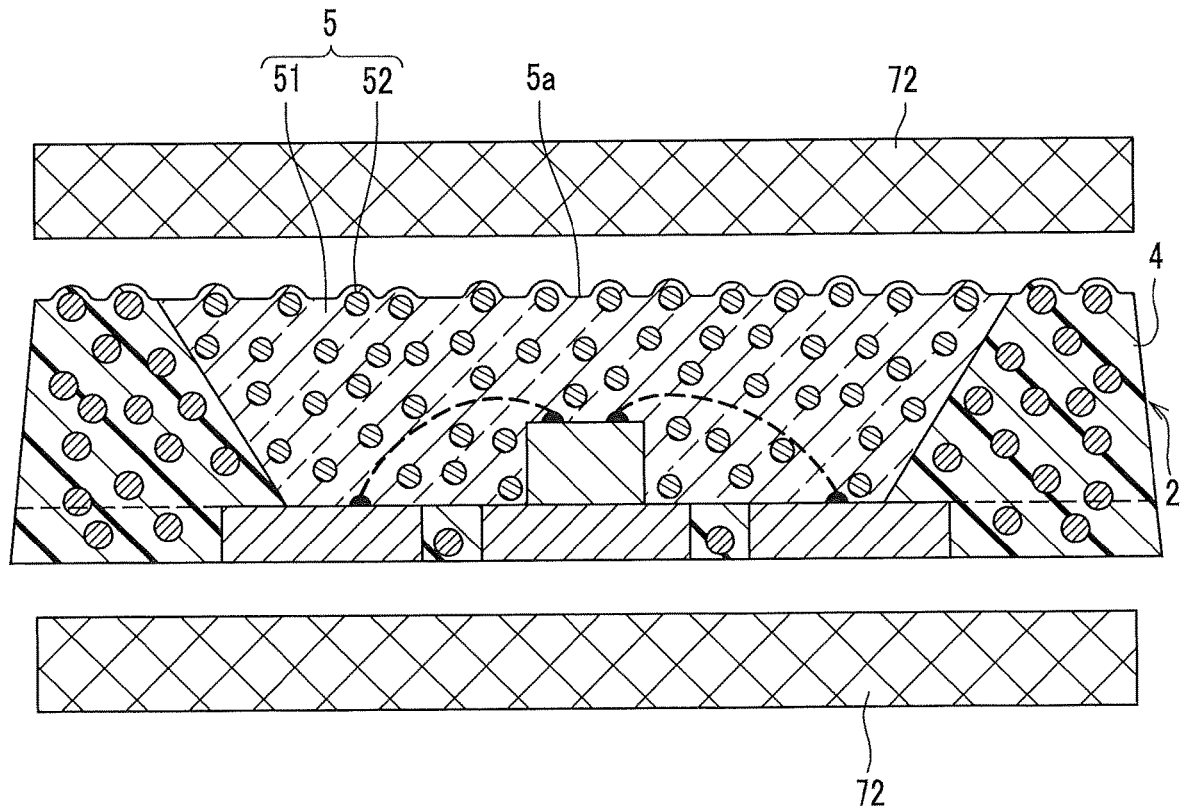
FIG. 3D is a cross-sectional view schematically showing a resin curing step in the method of manufacturing the light emitting device according to the present embodiment.
Figure 4:
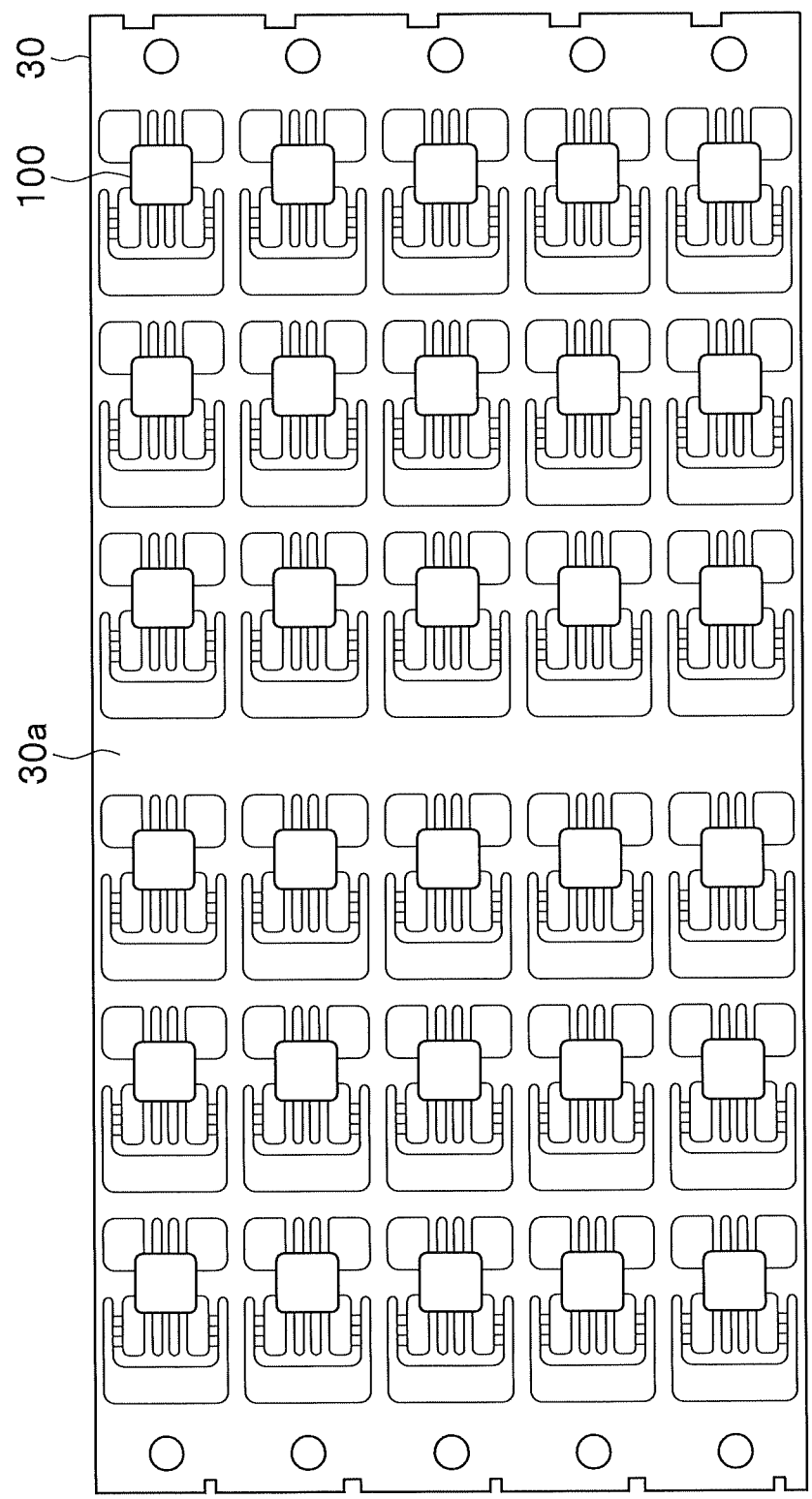
FIG. 4 is a plan view showing the structure of a lead frame provided in a lead frame providing step in the method of manufacturing the light emitting device according to the present embodiment.
Figure 5B:
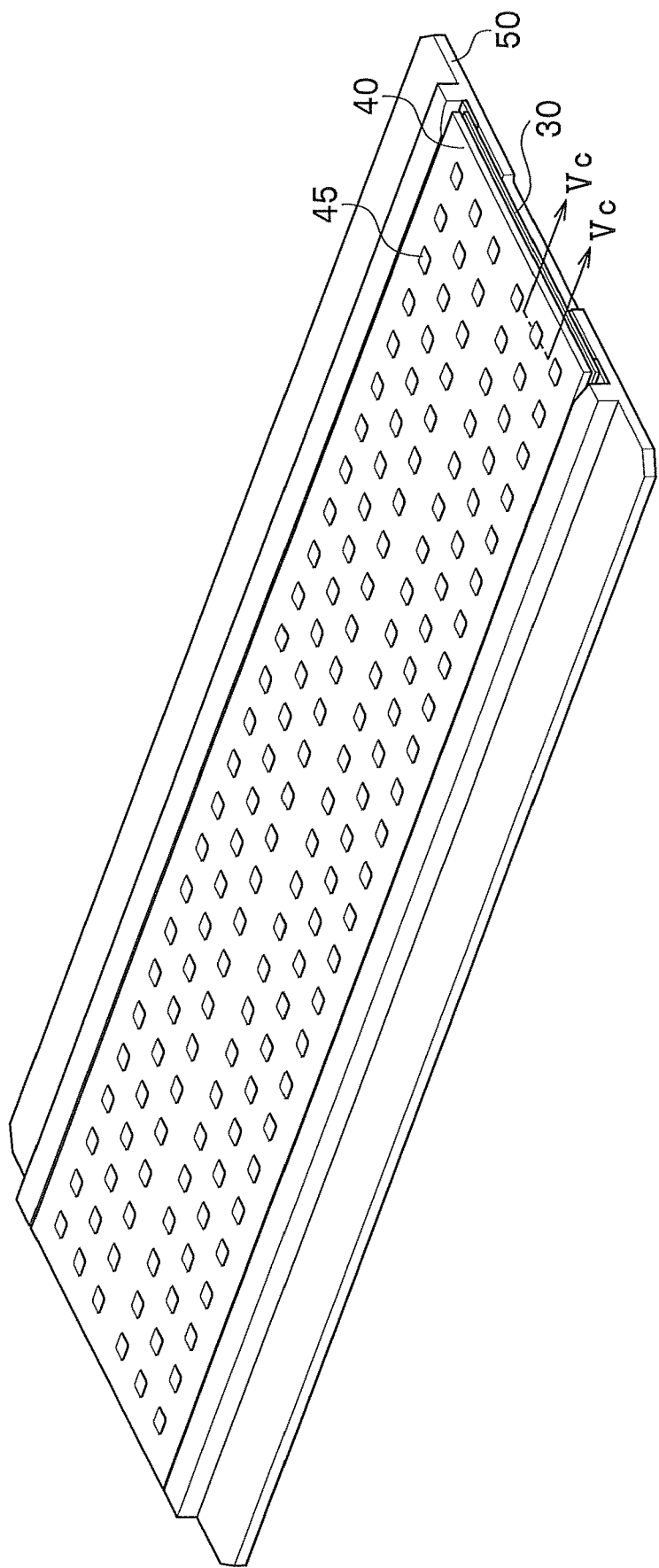
FIG. 5B is a perspective view schematically showing the state where a mask is placed in the mask placement step in the method of manufacturing the light emitting device according to the present embodiment.
Figure 5C:
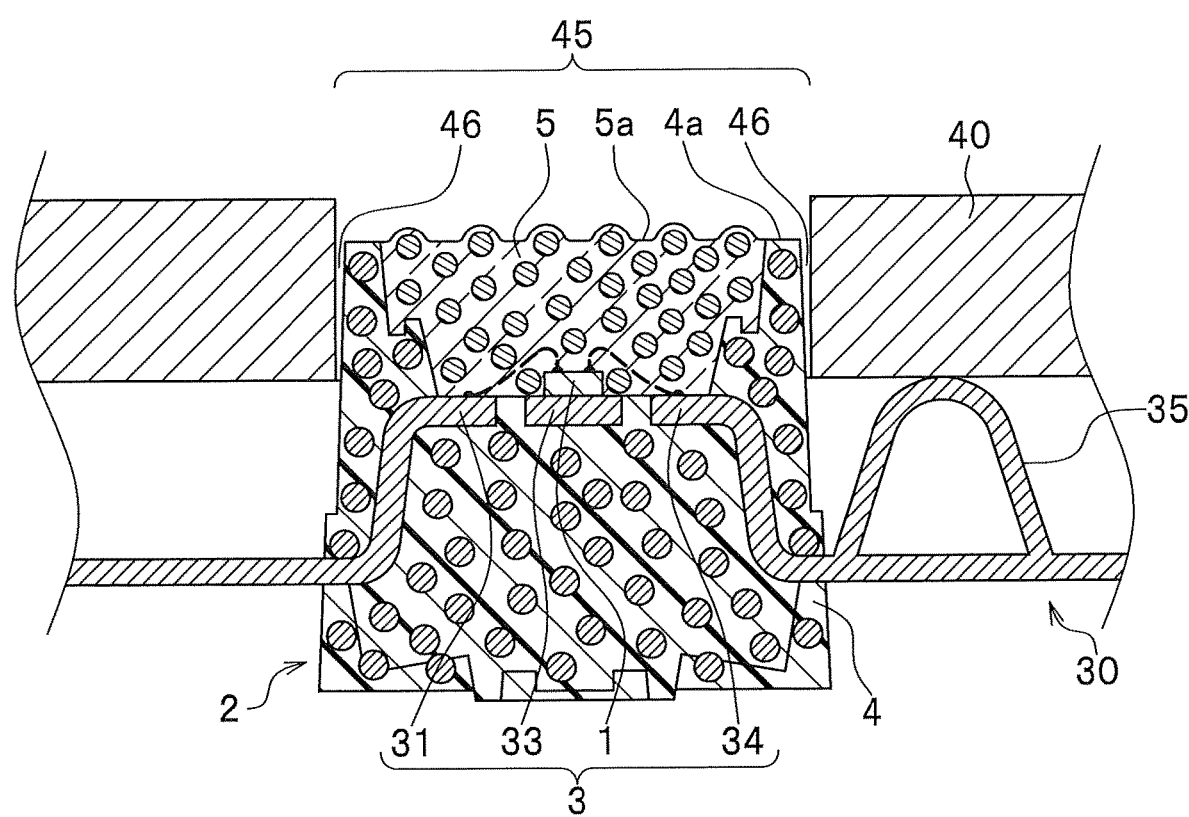
FIG. 5C is a cross-sectional view showing the mask placement step in the method of manufacturing the light emitting device according to the present embodiment, schematically showing the cross section taken along line VC-VC in FIG. 5B.
Figure 6A:
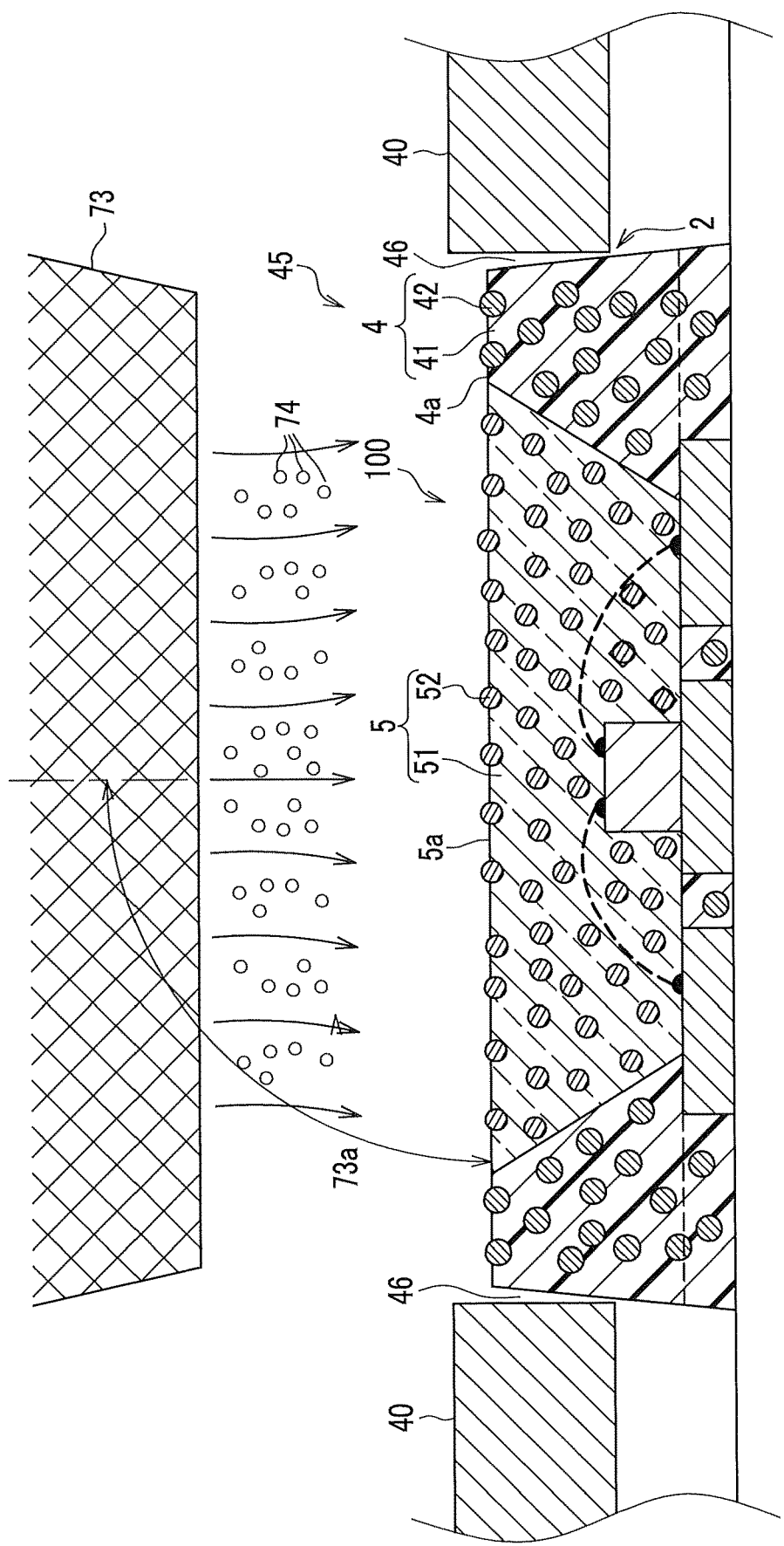
FIG. 6A is a cross-sectional view schematically showing an abrasive blasting step in the method of manufacturing the light emitting device according to the present embodiment.
Figure 6B:
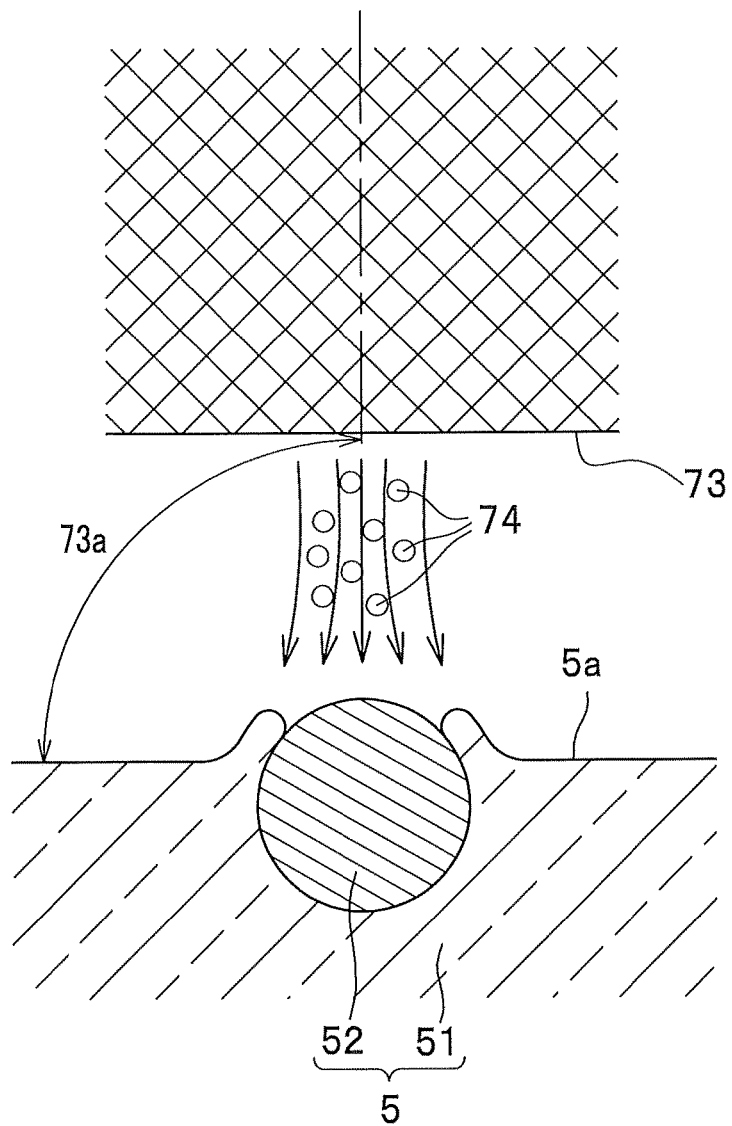
FIG. 6B is a schematic illustration showing a blasting angle of a nozzle in the abrasive blasting step in the method of manufacturing the light emitting device according to the present embodiment.
Figure 7:
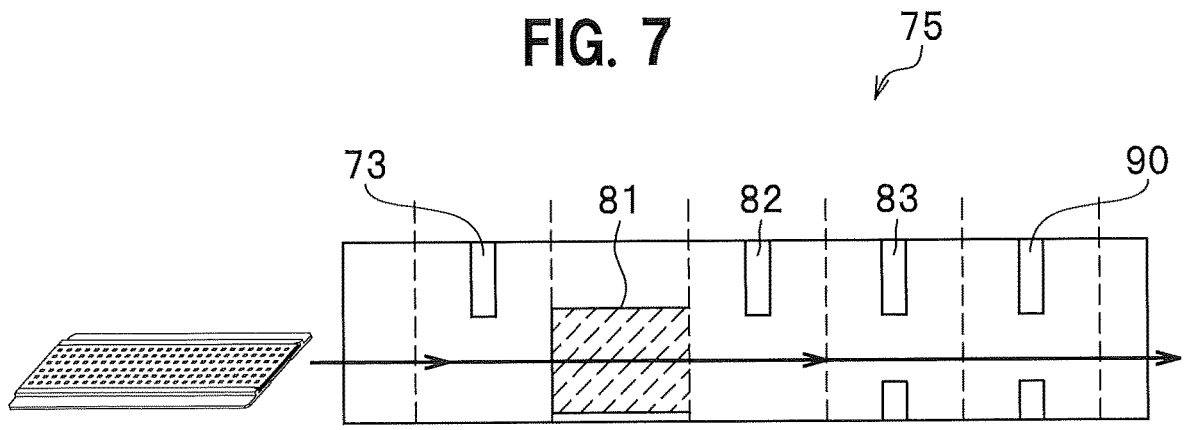
FIG. 7 is a schematic illustration showing a lead frame cleaning step and a lead frame draining step in the method of manufacturing the light emitting device according to the present embodiment.
Figure 8:
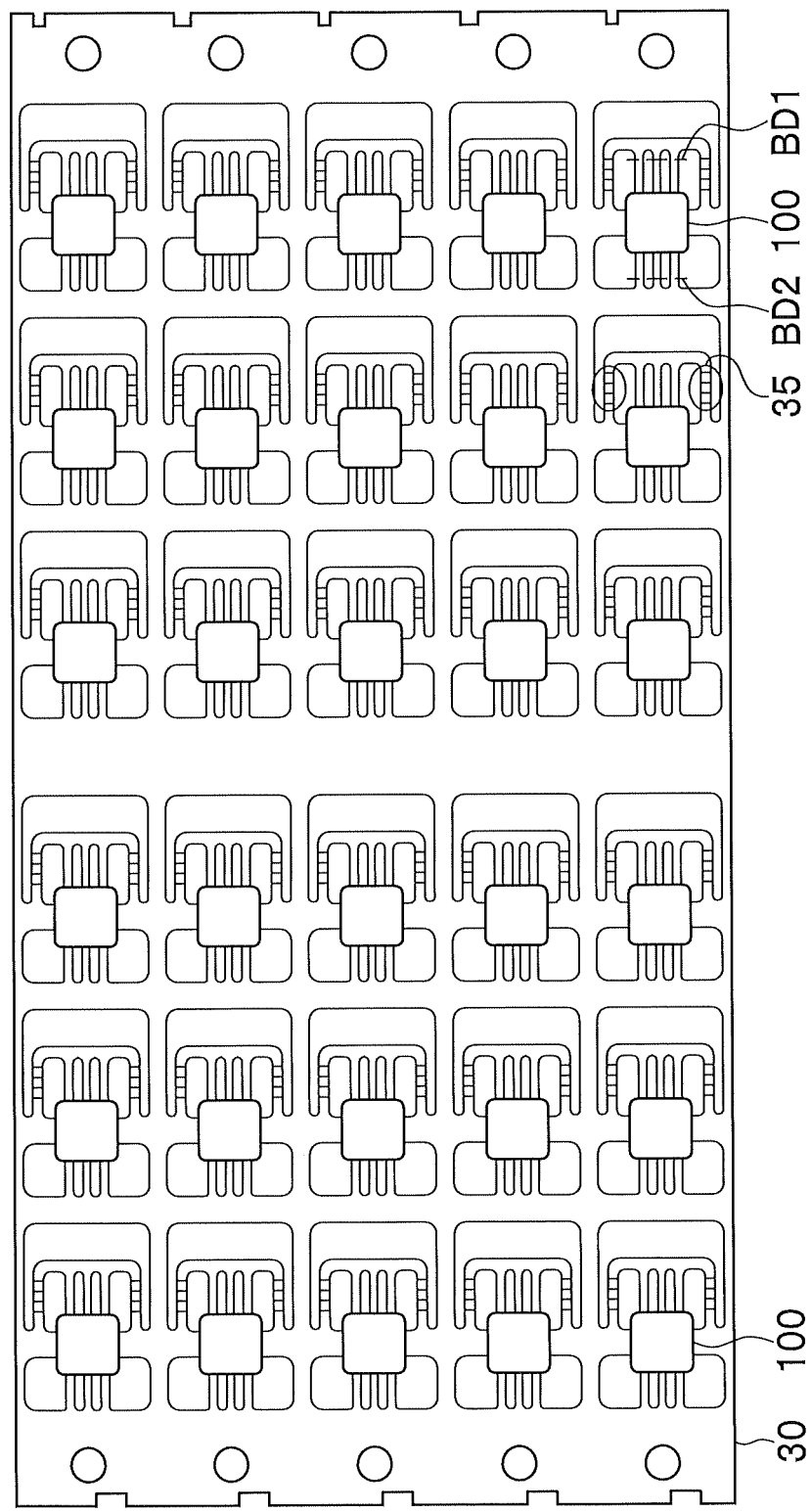
FIG. 8 is a plan view showing a light emission device singulating step in the method of manufacturing the light emitting device according to the present embodiment.
Figure 9:
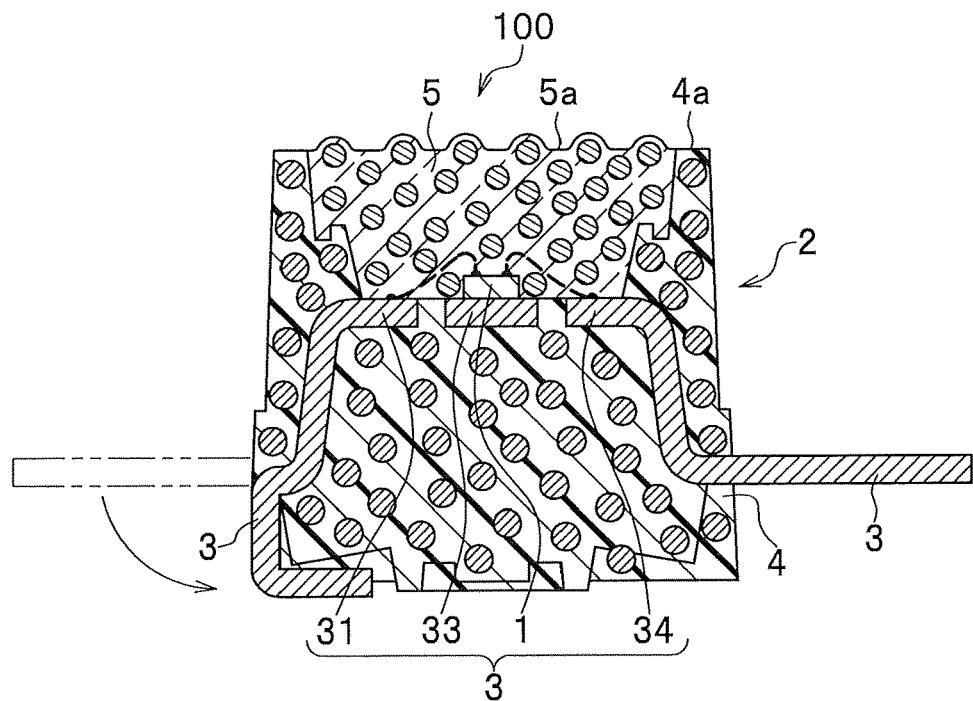
FIG. 9 is a cross-sectional view showing a lead electrode bending step in the method of manufacturing the light emitting device according to the present embodiment.

FIG. 2 is a flowchart showing the procedure of the method of manufacturing the light emitting device according to the present embodiment. FIG. 3A is a cross-sectional view schematically showing the structure of a resin molded body provided in a resin molded body providing step in the method of manufacturing the light emitting device according to the present embodiment (S1001). FIG. 3B is a cross-sectional view schematically showing the state where a light emitting element is mounted on the resin molded body in a light emitting element mounting step in the method of manufacturing the light emitting device according to the present embodiment (S1002). FIG. 3C is a cross-sectional view schematically showing the state in a resin supplying step in the method of manufacturing the light emitting device according to the present embodiment (S1003). FIG. 3D is a cross-sectional view schematically showing the state in a resin curing step in the method of manufacturing the light emitting device according to the present embodiment (S1004). FIG. 4 is a plan view showing the structure of a lead frame provided in a lead frame providing step in the method of manufacturing the light emitting device according to the present embodiment (S1005). FIG. 5A is a perspective view schematically showing the state in a mask mounting step in the method of manufacturing the light emitting device according to the present embodiment (S1006). FIG. 5B is a perspective view schematically showing the state where a mask is placed in a mask placement step in the method of manufacturing the light emitting device according to the present embodiment (S1006). FIG. 5C is a cross-sectional view schematically showing the state in a mask placement step in the method of manufacturing the light emitting device according to the present embodiment, showing the cross section taken along line VC-VC in FIG. 5B (S1006). FIG. 6A is a cross-sectional view schematically showing the state in an abrasive blasting step in the method of manufacturing the light emitting device according to the present embodiment (S1007). FIG. 6B is a schematic illustration showing a blasting angle of a nozzle in the abrasive blasting step in the method of manufacturing the light emitting device according to the present embodiment (S1007). FIG. 7 is a schematic illustration showing the state in a lead frame cleaning step and a lead frame draining step in the method of manufacturing the light emitting device according to the present embodiment (S1008, S1009). FIG. 8 is a plan view showing the state in a light emission device singulating step in the method of manufacturing the light emitting device according to the present embodiment. FIG. 9 is a cross-sectional view showing the state in a lead electrode bending step in the method of manufacturing the light emitting device according to the present embodiment.

In FIGS. 3A to 3D and 6A, the resin molded body 2 is shown by only its upper part that forms the bottom surface 2b and the lateral wall of the recess 2a, and the lower part is omitted.

The method of manufacturing the light emitting device 100 according to the present embodiment includes a resin molded body providing step S1001, a light emitting element mounting step S1002, a resin supplying step S1003, a resin curing step S1004, a lead frame providing step S1005, a mask placement step S1006, an abrasive blasting step S1007, a lead frame cleaning step S1008, a lead frame draining step S1009, a light emission device singulating step S1010, and a lead electrode bending step S1011.

As shown in FIG. 3A, the resin molded body providing step S1001 is a step of providing the resin molded body 2 in which the lead electrode 3 positioned at the bottom surface 2b. The resin molded body 2 has the recess 2a which opens upward and is surrounded by the light-shielding member 4 as the lateral wall.

Specifically, in the present step, a lead frame having the outer shape of the lead electrode 3 is formed by cutting out a metal plate by pressing. Subsequently, the lead frame is set between the upper and lower molds that define the space corresponding to the shape of the light-shielding member 4. Subsequently, a resin material as the base material 41 containing the second filler 42 is injected into the space of the mold. After the resin material is hardened or cured, the resin material is removed from the mold. Thus, the light-shielding member 4 is formed integrally with the lead electrode 3.

In the resin molded body 2 provided in the present step, the second filler 42 positioned near the surface 4a of the light-shielding member 4 are basically covered with the base material 41 because the abrasive blasting step is not yet performed, however, there may exist the second filler 42 not covered with the base material 41.

As shown in FIG. 3B, the light emitting element mounting step S1002 is a step of mounting the light emitting elements 1 in the recess 2a of the resin molded body 2. In the present step, the light emitting elements 1 (11 to 13) are die-bonded onto the lead electrode 33, and the light emitting elements 1 are respectively electrically connected to corresponding ones of the lead electrodes 31 to 36 with the wires 6.

As shown in FIG. 3C, the resin supplying step S1003 is a step of supplying a resin material to be the base material 51, which is uncured light-transmissive resin containing the particles of the first filler 52, to the recess 2a by, for example, potting using a dispenser 71. The first filler 52 preferably lower refractive index than the reflective index of the base material 51.

As shown in FIG. 3D, the resin curing step S1004 is a step of curing the resin material by heating the resin material using a heating device 72 such as a heater or a reflow oven. Thus, the light-transmissive member 5 covering the light emitting element 1 is formed in the recess 2a.

In the light-transmissive member 5 formed in the present step, the first filler 52 disposed near the surface 5a of the light-transmissive member 5 is basically covered with the base material 51 because the abrasive blasting step is not yet performed, however, there can exist the first filler 52 not covered with the base material 51.

As shown in FIG. 4, the lead frame providing step S1005 is a step of providing a lead frame 30 in which a plurality of light emitting devices 100 is formed. That is, the lead frame providing step S1005 is a step of providing the lead frame 30 in which a plurality of not-yet singulated light emitting devices 100 having undergone the resin molded body providing step S1001 to the resin curing step S1004 are arranged.

The lead frame 30 includes a protrusion 35 which is formed by part of the lead frame 30 being bent (see FIG. 5C). The protrusion 35 which will be described later is formed at the position adjacent to a region (i.e., a first region) where the light emitting device 100 is formed. The protrusion 35 which will be described later is disposed so that a mask 40 is disposed as being spaced apart by a predetermined distance from the surface 30a of the lead frame 30, and can serve as a supporting part for supporting the mask 40.

The lead frame 30 is preferably formed of a highly conductive metal material comprising, for example, Cu, Fe, or alloy of Cu and Fe. Further, the lead frame 30 preferably has its surface 30a covered with a metal film in order to improve the light reflectivity and/or the bondability to the wires 6, the die-bonding member and the like. The suitable metal film is Ag, Ag alloy, Au, or Au alloy, for example. Preferably, a layer including Ni is formed as the base layer of the metal film. Preferably, a layer including Ni/Pd, Ni/Au, or Ni/Pd/Au is formed as an upper surface of the base layer. The metal film can be formed by, for example, plating.

As shown in FIGS. 5A to 5C, the mask placement step S1006 is a step of providing the mask 40 having a plurality of through holes 45 and overlaying the mask 40 onto the lead frame 30 so that the resin molded body 2 and the light-transmissive member 5 are exposed at the through holes 45.

The mask 40 is mounted over the protrusion 35 so that the surface 4a of the light-shielding member 4 and the surface 5a of the light-transmissive member 5 are exposed at the through holes 45.

The mask 40 preferably includes a buffer at the inner lateral surfaces of each of the through holes 45. Provision of the buffer can keep a constant distance between the outer lateral surfaces of the resin molded body 2 and the inner lateral surfaces of each through hole 45. With this distance, direct contact can be avoided between the mask 40 and the resin molded body 2 when the mask 40 is overlaid on the lead frame 30, whereas the mask 40 is less likely to cause damage to the resin molded body 2. Further, in the abrasive blasting step, even in the case where the blow pressure of an abrasive blaster gun is high and the mask 40 warps, direct contact between the mask 40 and the resin molded body 2 is avoided, whereas the mask 40 is less likely to cause damage on the resin molded body 2.

The upper surface of the mask 40 is preferably set at a position higher than the upper surface of the resin molded body 2. By virtue of the upper surface of the mask 40 positioned higher than the upper surface of the resin molded body 2, in the abrasive blasting step, the outer lateral surfaces of the resin molded body 2 and the like can be prevented or alleviated from undergoing the abrasive blasting. That is, a particulate material can be securely blown in only the surface 4a of the light-shielding member 4 and the surface 5a of the light-transmissive member 5.

The thickness of the mask 40 is preferably 1 mm or more. The mask 40 having a proper thickness can prevent or alleviate warpage of the mask 40 in the abrasive blasting step.

The through holes 45 can be respectively provided corresponding to the resin molded bodies 2 individually spaced apart from one another, or can each be provided corresponding to a group of resin molded bodies 2 connected to each other in one direction. When the through holes 45 are respectively provided corresponding to the resin molded bodies 2 individually spaced apart from one another, the size of each of the through holes 45 is, for example, about 2.5 mm×about 2.5 mm. Further, for example, when the through holes 45 are each provided corresponding to a plurality of resin molded bodies 2 arranged continuously in line in the longitudinal direction of the lead frame 30, the through holes 45 are each formed to be rectangular.

When the mask 40 is overlaid on the lead frame 30, the position of the through holes 45 is preferably adjusted to the position where the surface 4a of the light-shielding member 4 and the surface 5a of the light-transmissive member 5 are exposed at the through holes 45 and the surface 30a of the lead frame 30 is covered with the mask 40. The shape of each of the through holes 45 can be, for example, square or rectangular as seen in a plan view corresponding to the shape of each resin molded body 2. Further, the size of each of the through holes 45 is preferably great enough to form a predetermined gap 46 between the inner lateral surfaces of each through hole 45 and the outer lateral surfaces of each resin molded body 2 when the mask 40 is overlaid on the lead frame 30. The existence of the gap 46 can make it difficult for the slurry to reach the surface 30a of the lead frame 30, and make it possible for a predetermined fluid to rinse the surface 30a of the lead frame 30.

The mask 40 including the through holes 45 having their position, size, and shape previously appropriately adjusted as described above allows a particulate material injected from the nozzle of the abrasive blaster gun in the abrasive blasting step to blow in accurately only the surface 4a of the light-shielding member 4 and the surface 5a of the light-transmissive member 5.

As shown in FIG. 6A, the abrasive blasting step S1007 is a step of performing abrasive blasting in which a particulate material is blown on the surface 4a of the light-shielding member 4 and the surface 5a of the light-transmissive member 5 via the mask 40. The steps from the abrasive blasting step S1007 to the lead frame draining step S1009 are performed using an abrasive blasting device 75, and the lead frame 30 and the mask 40 overlaid thereon are placed on the conveyer carrier 50 and carried to processing devices along the conveyance path (see FIG. 7).

After performing the present step, projections (i.e., surface irregularity) attributed to the particles of the first filler 52 are formed at the surface 5a of the light-transmissive member 5. Similarly, projections (i.e., surface irregularity) attributed to the particles of the second filler 42 are formed at the surface of the resin molded body 2.

The present step can prevent or alleviate removal of plating due to the surface 30a of the lead frame 30 undergoing the abrasive blasting with the particulate material. This is achieved by the above-described use of the mask 40, from which only the surface 4a of the light-shielding member 4 and the surface 5a of the light-transmissive member 5 are exposed without exposure of the surface 30a of the lead frame 30.

The abrasive blasting is preferably performed by wet blasting, in which slurry is blasted onto the processing target surface from the nozzle 73. The wet blasting can reduce the shock given on the processing target by an abrasive agent 74 object as compared to dry blasting. Thus, a relatively soft resin material can be selectively ground thereby removed without greatly damaging inorganic particles used as the first filler 52 and the second filler 42. Further, the wet blasting is suitable to minute processing, because the abrasive agent 74 of a smaller particle size can be used. Thus, while preventing or alleviating formation of coarse irregular shapes on the surface 5a of the light-transmissive member 5 and the surface 4a of the light-shielding member 4, the base material 51 and the base material 41 that respectively cover the surface of the first filler 52 and the surface of the second filler 42 can be removed.

The slurry can be, for example, pure water containing the abrasive agent 74 being a particulate material. The abrasive agent 74 is preferably higher in hardness than the base material 51 and the base material 41 removed by the abrasive blasting. For example, the abrasive agent 74 can be glass, alumina ($Al_2O_3$), silicon carbide (SiC), stainless steel, zirconia ($ZrO_2$), resin or the like.

The particle size of the abrasive agent 74 preferably is in a range of about 2 μm to about 14 μm inclusive. Further, when the slurry comprising pure water containing the abrasive agent 74 is employed in the wet blasting, the content of the abrasive agent 74 in the slurry preferably is in a range of about 5 volume % to 30 volume %.

In the present step, use of the mask 40 in which only the surface 4a of the light-shielding member 4 and the surface 5a of the light-transmissive member 5 are exposed can prevent or alleviate the surface 30a of the lead frame 30 from being roughened by the abrasive agent 74. This function can realize the light emitting device 100 with reduced occurrence of voids at the bonded portion in solder mounting which is performed after the light emitting device 100 is manufactured, while preventing or alleviating a reduction in joining strength between the lead electrode and the mounting board.

In the present step, use of the resin molded body 2 of which at least one portion of the outer lateral surfaces is inclined and outwardly spreading from the light extraction surface toward the bottom surface makes it easier to blow the particulate material in the surface 4a of the light-shielding member 4 and the surface 5a of the light-transmissive member 5 exposed at the through holes 45, while making it difficult to blow it in the surface 30a of the lead frame 30.

In the present step, the abrasive blasting is performed on the surface 4a of the light-shielding member 4 and the surface 5a of the light-transmissive member 5 in such a manner as to expose the first filler 52 and the second filler 42, so that the surface 4a of the light-shielding member 4 and the surface 5a of the light-transmissive member 5 are finely roughed. Thus, the light diffusion property of these surfaces improves, and the anti-reflection effect is exhibited at the surfaces. These factors contribute to realize the light emitting device 100 which is less influenced by the reflection of extraneous light. In removing the base material 51 covering the first filler 52 located near the surface 5a of the light-transmissive member 5 and the base material 41 covering the second filler 42 near the surface 4a of the light-shielding member 4, preferably the abrasive blasting is performed at a predetermined blow pressure so that the first filler 52 and the second filler 42 can respectively be maintained in the base material 51 and the base material 41 remained as part of the light emitting device 100 as much as possible.

As shown in FIG. 6B, a blasting angle 73a of the slurry containing the abrasive agent 74 is preferably in a range of 80° to 100°, more preferably around 90°, relative to the surface 4a of the light-shielding member 4 and the surface 5a of the light-transmissive member 5 which is the target surface of the abrasive blasting.

Blasting the abrasive agent 74 at the blasting angle 73a which is substantially perpendicular (90°) to the target surface of the abrasive blasting can prevent or alleviate a possibility that the slurry is blown on the surface 30a of the lead frame 30. Accordingly, setting the blasting angle 73a to be in the above-described range, the base material 41 at the surface of the second filler 42 and the base material 51 at the surface of the first filler 52 can be efficiently removed. Further, with such a blasting angle, the abrasive agent 74 is less likely to remain on or to be embedded in the surface 30a of the lead frame 30 having undergone the abrasive blasting.

Further, in the wet blasting, the slurry with compressed air is blasted from the nozzle 73 of the abrasive blaster gun toward the processing target surface. The pressure of the compressed air (i.e., the blow pressure of the abrasive blaster gun) at this time can be in a range of, for example, about 0.1 MPa to about 0.5 MPa, while the preferable value varies depending on the shape of the nozzle 73, the blasting angle 73a, the material, shape, or particle size of the abrasive agent 74 and the like.

As shown in FIG. 7, the lead frame cleaning step S1008 is a step of cleaning the mask 40 and the lead frame 30 placed on the conveyer carrier 50 with a plurality of cleaning devices. The mask 40 and the lead frame 30 placed on the conveyer carrier 50 are herein carried in order of a first cleaning device 81, a second cleaning device 82, and a third cleaning device 83 along the conveyance path.

In a first cleaning step S1008a, the conveyer carrier 50 carrying the lead frame 30 and the mask 40 overlaid thereon is conveyed to the first cleaning device 81 in the arrow direction shown in FIG. 7.

The first cleaning device 81 (for example, a rinse tank) cleans the lead frame 30 with fluid (for example, water) capable of passing through a gap 46 (see FIG. 5C) formed between the outer lateral surfaces of the resin molded body 2 and the inner lateral surfaces of the corresponding through hole 45 of the mask 40. The first cleaning device 81 rinses out the particulate material attached to the surface 30a of the lead frame 30.

The gap 46 is preferably adjusted to have a width through which the fluid for cleaning the surface 30a of the lead frame 30 is likely to pass, but the slurry for abrasive blasting the surface 30a of the lead frame 30 is less likely to pass. The width of the gap 46 is preferably in a range of 0.04 mm to 0.06 mm, more preferably about 0.05 mm. The width of the gap 46 is 10 to 20 times as great as the particle size of the abrasive agent 74. The width of the gap 46 is appropriately adjusted and the outer lateral surfaces of the resin molded body 2 is inclined and outwardly spreads from the light extraction surface toward the bottom surface. This facilitates easy rinse off of the particulate material attached to the surface 30a of the lead frame 30.

Subsequently, in a second cleaning step S1008b, the conveyer carrier 50 carrying the lead frame 30 and the mask 40 overlaid thereon is carried to the second cleaning device 82 from the first cleaning device 81 in the arrow direction shown in FIG. 7.

The second cleaning device 82 (for example, a rinse shower) cleans the lead frame 30 with fluid (for example, water) capable of passing through the gap 46 formed between the outer lateral surfaces of the resin molded body 2 and the inner lateral surfaces of the corresponding through hole 45 of the mask 40. The second cleaning device 82 rinses out the particulate material that failed to be rinsed out with the first cleaning device 81 and remains on the surface 30a of the lead frame 30.

Subsequently, in a third cleaning step S1008c, the conveyer carrier 50 carrying the lead frame 30 and the mask 40 overlaid thereon is carried to the third cleaning device 83 from the second cleaning device 82 in the arrow direction shown in FIG. 7.

The third cleaning device 83 (for example, a rinse jet) cleans the lead frame 30 with fluid (for example, water) capable of passing through the gap 46 formed between the outer lateral surfaces of the resin molded body 2 and the inner lateral surfaces of corresponding through hole 45 of the mask 40. The third cleaning device 83 rinses out the particulate material that failed to be rinsed out by the second cleaning device 82 and remains on the surface 30a of the lead frame 30.

The water used in the second cleaning device 82 is preferably higher in purity than purity of the water used in the first cleaning device 81, and the water used in the third cleaning device 83 is even higher in purity than purity of the water used in the second cleaning device 82.

As shown in FIG. 7, the lead frame draining step S1009 is a step of draining the mask 40 and the lead frame 30 placed on the conveyer carrier 50 with a draining device 90. From the lead frame 30 cleaned with the first cleaning device 81, the second cleaning device 82, and the third cleaning device 83, moisture is ultimately removed with the draining device 90.

The draining device 90 removes the moisture on the surface 30a of the lead frame 30 by, for example, blowing air or warm air on the mask 40 and the lead frame 30 placed on the conveyer carrier 50. The method of draining with the draining device 90 is not particularly specified.

As shown in FIG. 8, the light emission device singulating step S1010 is a step of cutting the lead frame 30 along a boundary line BD1 and a boundary line BD2 which are set between the light emitting devices 100, thereby singulating the light emitting devices 100.

In the present step, grooves penetrating through the lead frame 30 in a thickness direction along the boundary line BD1 and the boundary line BD2 are formed using a dicing device or the like, the lead frame 30 is cut and the light emitting devices 100 are singulated. Each of the light emitting devices 100 singulated in the present step have undergone the abrasive blasting, and therefore, part of the particles of the second filler 42 contained in the light-shielding member 4 is exposed outside the base material 41 of the light-shielding member 4 at the surface 4a of the light-shielding member 4, and part of the particles of the first filler 52 contained in the light-transmissive member 5 is exposed outside the base material 51 of the light-transmissive member 5 at the surface 5a of the light-transmissive member 5.

As shown in FIG. 9, the lead electrode bending step S1011 is a step of bending the lead electrode 3 supported by the resin molded body 2 and exposed at the outer lateral surfaces of the resin molded body 2 toward the back surface side of the resin molded body 2 along the outer surface of the resin molded body 2. Thus, the lead electrode 3 is bent from the outer lateral surfaces of the resin molded body 2 toward the back surface of the resin molded body 2.

Portions of each of the lead electrodes 31 to 36 which are bent from the outer lateral surfaces of the resin molded body 2 toward the back surface of the resin molded body 2 are the bonded portions bonded to the mounting board with a conductive bonding member such as solder. Because the surface 30a of the lead frame 30 has not been subjected to the abrasive blasting, voids is less likely to be generated at the bonded portion on which solder mounting is performed after the light emitting device 100 is manufactured. Thus the lead electrode and the mounting board are firmly bonded to each other via the conductive bonding member.

Through the above-described steps, the light emitting device 100 is manufactured.

In the light emitting device 100 manufactured according to the above-described manufacturing method, the joining strength between the lead electrode and the mounting board does not reduce because the lead electrode is not subjected to abrasive blasting. Further, in the light emitting device 100 manufactured according to the above-described manufacturing method is less influenced by the reflection of extraneous light, because the surface of the resin molded body 2 and the surface of the light-transmissive member 5 are appropriately subjected to abrasive blasting. That is, the method of manufacturing a light emitting device can realize a light emitting device with less influenced by the reflection of extraneous light without reducing the joining strength between the lead electrode and the mounting board.

EXAMPLE

Figure 10:
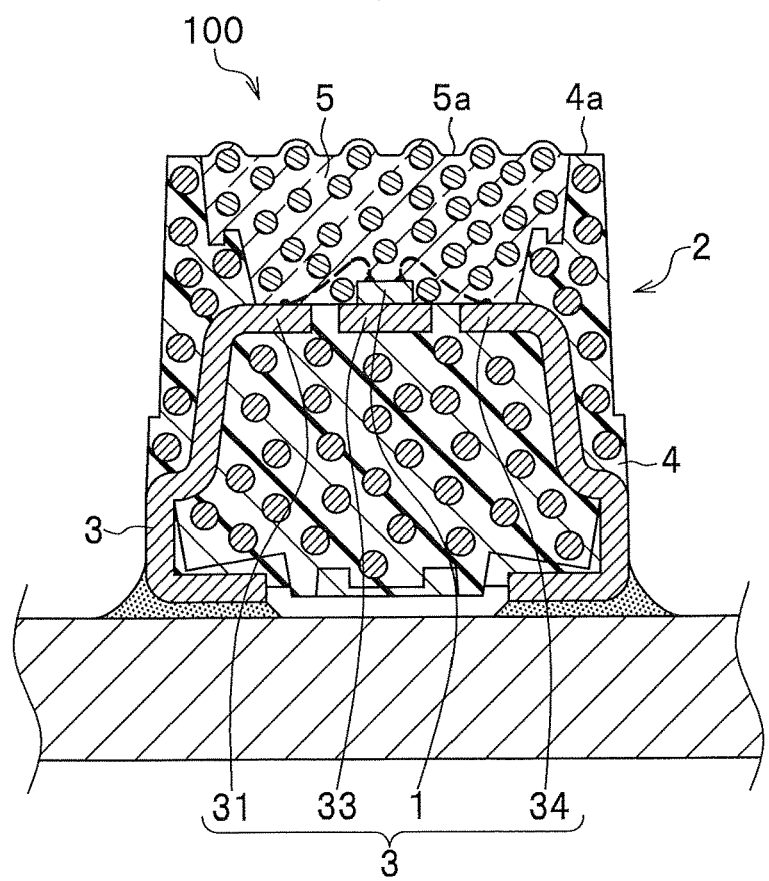
FIG. 10 is a cross-sectional view showing the manner of solder bonding between the light emitting device and a mounting board.

A description will now be given of an Example of a light emitting device 100 manufactured according to the method of manufacturing the light emitting device according to the present embodiment. The light emitting device 100 was manufactured. Then, as shown in FIG. 10, the lead electrode 3 and a mounting board 200 were bonded to each other by using solder 150. The bonded portion between the lead electrode 3 and the mounting board 200 is determined as a bonded portion X. The sample after the bonding is determined as the "sample of Example".

Figure 11A:
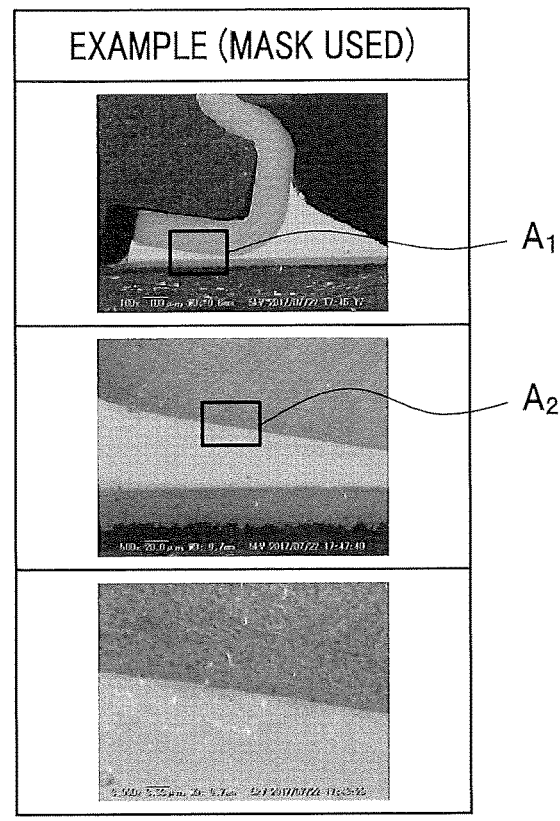
FIG. 11A is a cross-sectional SEM image showing the manner of solder bonding in a light emitting device according to Example.

The top one of images in FIG. 11A shows the bonded portion X in FIG. 10; the middle one of the images in FIG. 11A is an enlarged view of a region A1; and the bottom one of the images in FIG. 11A is an enlarged view of a region A2.

In the following, details of the constituents of the sample of Example are shown.
Shape and Material of Light Emitting Device
  Lead electrode
  Material: Cu alloy having a thickness of 0.15 mm
  Plating: Ag plating having a thickness of 2.5 µm or more
  Light-transmissive member
  Base material: epoxy resin (refractive index: 1.5)
  First filler: crushed silica (content: about 20 mass %), spherical silica (particle size: about 10 µm, content: about 40 mass %)
  Light-shielding member (light-absorptive member)
  Base material: polyamide resin (containing carbon black by about 1 mass %)
  Second filler: wollastonite (content: about 40 mass %)
  Resin molded body
  Outer dimension as seen in a plan view: 2.6 mm per side
  Dimensions of opening of light-transmissive member: 2.0 mm×2.2 mm
  Light emitting elements
  One blue LED, one green LED, and one red LED
Conditions of Abrasive Blasting
  Mask: used
  Abrasive liquid (slurry)
  Solvent: pure water
  Abrasive agent: low-alkali glass (particle size: 2 µm to 20 µm)
    Shape: spherical
    Specific gravity: 2.6
    Composition: $SiO_2$ (55.5%), CaO (23.1%), $Al_2O_3$ (14.0%), $B_2O_3$ (5.7%), MgO (1.0%), $Na_2O$ (0.5%), $Fe_2O_3$ (0.29%)
    Color: white
  Blasting angle: 90°
  Blasting direction: single direction
  Blow pressure: 0.25 (MPa)
  Processing speed: 5 mm/sec
  Abrasive blasting device: mini-PFE
  Under the above-described conditions, the abrasive blasting was performed on the surface of the resin molded body 2 and the surface 5a of the light-transmissive member 5 by spraying the abrasive liquid with compressed air from the nozzle in a mist-like manner.

Condition of Solder Mounting
  Solder
  Material: Sn—Ag—Cu
  Mounting Board
  Material: glass epoxy mounting board, Cu wiring

COMPARATIVE EXAMPLE

Figure 11B:
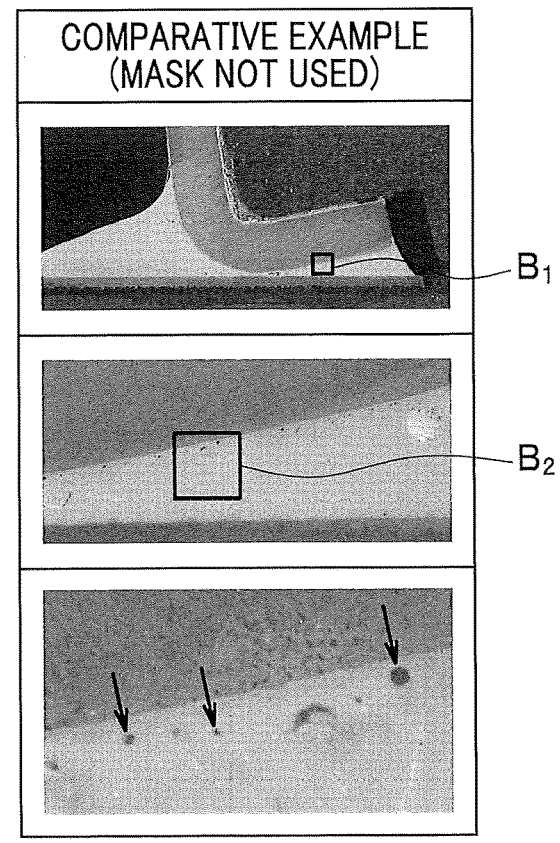
FIG. 11B is a cross-sectional SEM image showing the manner of solder bonding in a light emitting device according to Comparative Example.
Figure 12:
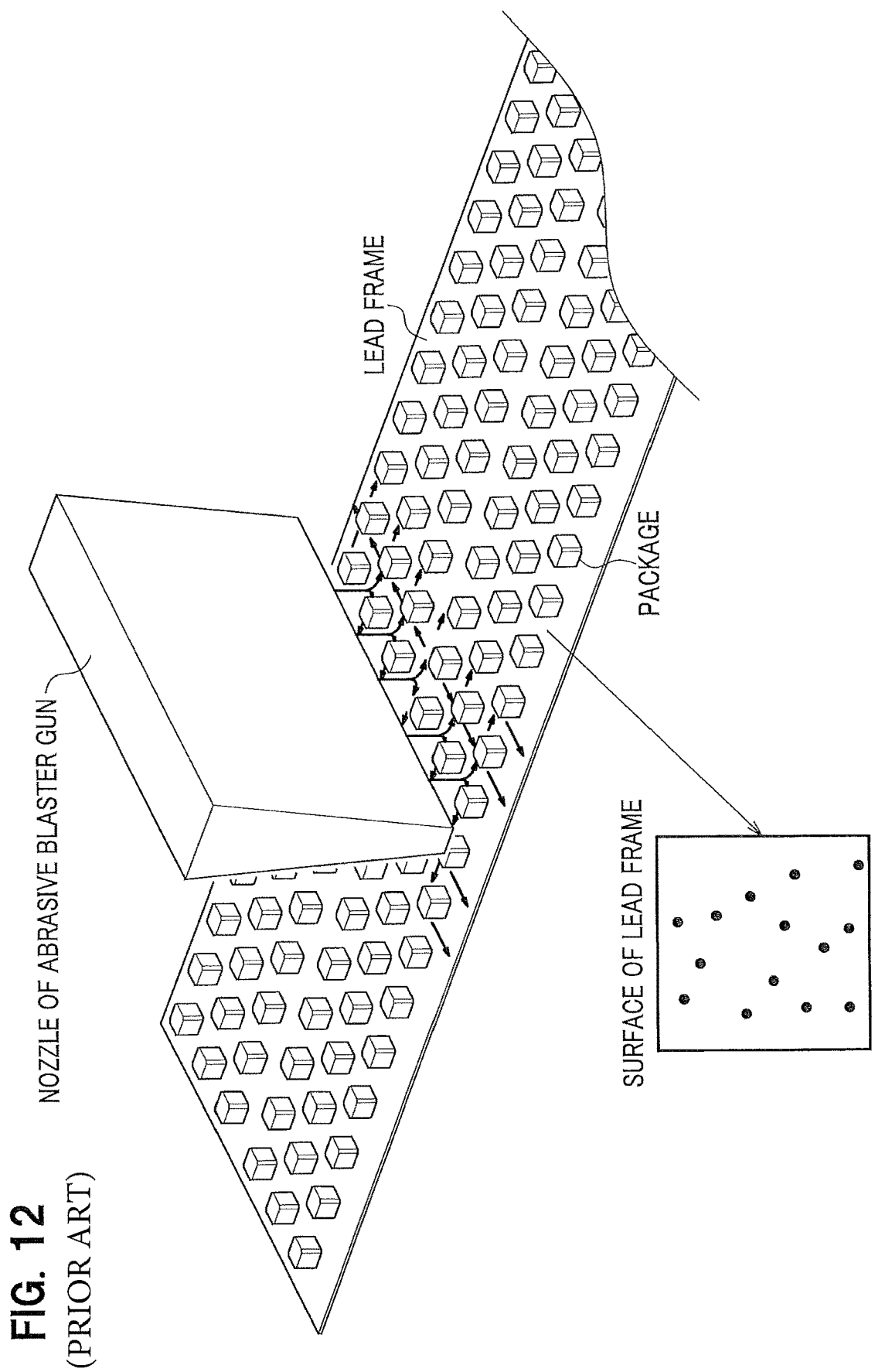
FIG. 12 is a schematic illustration showing an abrasive blasting step in a method of manufacturing a light emitting device according to a conventional example.

In order to compare against the "sample of Example", a "sample of Comparative Example" was manufactured. The top one of images in FIG. 11B shows the bonded portion X in FIG. 10; the middle one of the images in FIG. 11B is an enlarged view of a region B1; and the bottom one of the images in FIG. 11B is an enlarged view of a region B2.

The "sample of Comparative Example" is different from the "sample of Example" only in that the mask is not used in the above-noted abrasive blasting conditions. Other conditions are all identical to those of the "sample of Example". Details of the constituents of the "sample of Comparative Example" are as described above.
Evaluation The evaluation result of the "sample of Example" and the "sample of Comparative Example" is shown in FIGS. 11A and 11B.

When the mask 40 was used in the abrasive blasting, as shown in FIG. 11A, it can be seen that substantially no voids have occurred at the bonded portion X. That is, it is verified that, in the bonded portion X, the lead electrode 3 and the mounting board 200 are strongly bonded to each other via the solder 150, and the joining strength between the lead electrode 3 and the mounting board 200 is not reduced.

Accordingly, it is found that use of the mask 40 in the abrasive blasting step avoids abrasive blasting on the surface 30a of the lead frame 30, and the abrasive blasting acts only on the surface of the resin molded body 2 of the light emitting device 100 (i.e., the surface 4a of the light-shielding member 4) and the surface 5a of the light-transmissive member 5.

On the other hand, when the mask 40 was not used in abrasive blasting, as shown in FIG. 11B, it can be seen that numerous voids were generated at the bonded portion X as indicated by the arrows. That is, it is confirmed that there exists a plurality of portions where the lead electrode 3 and the mounting board 200 fail to be bonded to each other via the solder 150 in the bonded portion X, and the joining strength between the lead electrode 3 and the mounting board 200 is extremely low.

Accordingly, it can be seen that, by using no mask 40 in the abrasive blasting step, the surface 30a of the lead frame 30 is subjected to the abrasive blasting not only the surface of the resin molded body 2 in the light emitting device 100 (i.e., the surface 4a of the light-shielding member 4) and the surface 5a of the light-transmissive member 5.

From the foregoing experimental result, it can be seen that use of the mask in the abrasive blasting step realizes a light emitting device which is less influenced by the reflection of extraneous light without reducing the joining strength between the lead electrode and the mounting board.

The light emitting device according to the embodiment of the present disclosure is applicable to a backlight light source of a liquid crystal display, various illumination devices, a large-size display, various types of display devices such as advertisement and destination guides, an image reading device in a digital video camera, a facsimile, a copier, or a scanner, or a projector device.

What is claimed is:

1. A method of manufacturing a light emitting device, the method comprising:
   providing a lead frame including a plurality of light emitting devices, each light emitting device of the plurality of light emitting devices including:
      a light emitting element;
      a resin molded body; and
      a light-transmissive member,
      the resin molded body including:
         a lead electrode on which the light emitting element is mounted; and
         a light-shielding member which supports the lead electrode,
      the light-shielding member having a recess accommodating the light emitting element, and
      the light-transmissive member being disposed in the recess;
   providing a mask including a plurality of through holes, and overlaying the mask on the lead frame so that the resin molded body and the light-transmissive member are exposed at the through holes; and
   performing abrasive blasting by blowing a particulate material on a surface of the resin molded body and a surface of the light-transmissive member.

2. The method of manufacturing the light emitting device according to claim 1, wherein the abrasive blasting is wet blasting which blows slurry containing water and an abrasive agent which is the particulate material.

3. The method of manufacturing the light emitting device according to claim 2, wherein, in the abrasive blasting, the slurry is blown at an angle in a range of 80° to 100° relative to the surface of the resin molded body.

4. The method of manufacturing the light emitting device according to claim 1, further comprising bending a portion of the lead electrode exposed at an outer lateral surface of the resin molded body along an outer surface of the resin molded body, after the abrasive blasting is performed.

5. The method of manufacturing the light emitting device according to claim 1, wherein an outer lateral surface of the resin molded body is inclined and outwardly spreading from an upper surface toward a bottom surface of the resin molded body.

6. The method of manufacturing the light emitting device according to claim 1, wherein a gap for rinsing out the particulate material in the abrasive blasting is formed between an outer lateral surface of the resin molded body of each of the light emitting devices and an inner lateral surface of corresponding one of the through holes of the mask.

7. The method of manufacturing the light emitting device according to claim 4, wherein a gap for rinsing out the particulate material in the abrasive blasting is formed between an outer lateral surface of the resin molded body of each of the light emitting devices and an inner lateral surface of corresponding one of the through holes of the mask.

8. The method of manufacturing the light emitting device according to claim 7, further comprising cleaning the lead frame with a fluid capable of passing through the gap, wherein the cleaning is performed after the abrasive blasting is performed on the surface of the resin molded body and before the bending of the lead electrode.

9. The method of manufacturing the light emitting device according to claim 1, wherein the mask includes a buffer at an inner lateral surface of each of the through holes of the mask.

10. The method of manufacturing the light emitting device according to claim 1, wherein an upper surface of the mask is set at a position higher than an upper surface of the resin molded body.

11. The method of manufacturing the light emitting device according to claim 2, wherein a particle size of the particulate material is in a range of 2 μm to 14 μm inclusive.

12. The method of manufacturing the light emitting device according to claim 1, wherein
   the lead frame includes a first region where the light emitting device is formed, and the lead frame further includes a protrusion formed at a position adjacent to the first region, and
   the mask is supported by the protrusion.

13. The method of manufacturing the light emitting device according to claim 1, wherein the light-shielding member contains a light-absorptive substance.

14. The method of manufacturing the light emitting device according to claim 1, wherein the abrasive blasting is performed with the mask overlaid on the lead frame so that portions of the resin molded body and the light-transmissive member that are exposed at the through holes are abrasively blasted by the particulate material.

* * * * *